(12) United States Patent
Munch et al.

(10) Patent No.: US 7,201,214 B2
(45) Date of Patent: Apr. 10, 2007

(54) REMEDIES TO PREVENT CRACKING IN A LIQUID SYSTEM

(75) Inventors: Mark Munch, Los Altos Hills, CA (US); Kenneth Goodson, Belmont, CA (US); David Corbin, Los Altos Hills, CA (US); Shulin Zeng, Sunnyvale, CA (US); Thomas W. Kenny, San Carlos, CA (US); James Gill Shook, Santa Cruz, CA (US)

(73) Assignee: Cooligy, Inc., Mountain View, CA (US)

( * ) Notice: Subject to any disclaimer, the term of this patent is extended or adjusted under 35 U.S.C. 154(b) by 1 day.

(21) Appl. No.: 11/111,535

(22) Filed: Apr. 20, 2005

(65) Prior Publication Data
US 2005/0210913 A1 Sep. 29, 2005

Related U.S. Application Data

(62) Division of application No. 10/643,641, filed on Aug. 18, 2003.

(60) Provisional application No. 60/444,269, filed on Jan. 31, 2003.

(51) Int. Cl.
*F28F 7/00* (2006.01)
*F28F 3/14* (2006.01)
*F25D 23/12* (2006.01)

(52) U.S. Cl. .................... 165/82; 165/81; 165/170; 165/104.33; 62/259.2

(58) Field of Classification Search ............. 165/80.4, 165/81, 82, 83, 168, 170, 278, 104.33, 281, 165/85, 286; 62/430, 259.2
See application file for complete search history.

(56) References Cited

U.S. PATENT DOCUMENTS

| 596,062 A | 12/1897 | Firey |
| 2,039,593 A | 5/1936 | Hubbuch et al. |
| 2,273,505 A | 2/1942 | Florian |
| 2,600,103 A | 6/1952 | Feck ................. 119/77 |
| 3,267,859 A | 8/1966 | Jutila |
| 3,361,195 A | 1/1968 | Meyerhoff et al. |
| 3,554,669 A | 1/1971 | Reader |
| 3,654,988 A | 4/1972 | Clayton, III |
| 3,771,219 A | 11/1973 | Tuzi et al. |
| 3,817,321 A | 6/1974 | von Cube et al. |
| 3,823,572 A | 7/1974 | Cochran, Jr. |

(Continued)

FOREIGN PATENT DOCUMENTS

JP 10-99592 4/1998

(Continued)

OTHER PUBLICATIONS

Stephen C. Jacobson et al., "Fused Quartz Substrates for Microchip Electrophoresis", Analytical Chemistry, vol. 67, No. 13, Jul. 1, 1995, pp. 2059-2063.

(Continued)

*Primary Examiner*—Chen Wen Jiang
(74) *Attorney, Agent, or Firm*—Haverstock & Owens LLP

(57) ABSTRACT

A liquid cooling system utilizing minimal size and volume enclosures, air pockets, compressible objects, and flexible objects is provided to protect against expansion of water-based solutions when frozen. In such a system, pipes, pumps, and heat exchangers are designed to prevent cracking of their enclosures and chambers. Also described are methods of preventing cracking in a liquid cooling system. In all these cases, the system must be designed to tolerate expansion when water is frozen.

11 Claims, 9 Drawing Sheets

U.S. PATENT DOCUMENTS

| | | |
|---|---|---|
| 3,923,426 A | 12/1975 | Theeuwes .................... 417/48 |
| 3,948,316 A | 4/1976 | Souriau |
| 4,109,707 A | 8/1978 | Wilson et al. |
| 4,138,996 A | 2/1979 | Cartland |
| 4,203,488 A | 5/1980 | Johnson et al. |
| 4,211,208 A | 7/1980 | Lindner |
| 4,235,285 A | 11/1980 | Johnson et al. |
| 4,312,012 A | 1/1982 | Frieser et al. |
| 4,345,267 A | 8/1982 | Corman et al. |
| 4,450,472 A | 5/1984 | Tuckerman et al. |
| 4,467,861 A | 8/1984 | Kiseev et al. |
| 4,485,429 A | 11/1984 | Mittal |
| 4,494,171 A | 1/1985 | Bland et al. .................. 361/386 |
| 4,516,632 A | 5/1985 | Swift et al. |
| 4,540,115 A | 9/1985 | Hawrylo |
| 4,561,040 A | 12/1985 | Eastman et al. |
| 4,567,505 A | 1/1986 | Pease et al. |
| 4,573,067 A | 2/1986 | Tuckerman et al. |
| 4,574,876 A | 3/1986 | Aid |
| 4,644,385 A | 2/1987 | Nakanishi et al. |
| 4,716,494 A | 12/1987 | Bright et al. |
| 4,758,926 A | 7/1988 | Herrell et al. |
| 4,866,570 A | 9/1989 | Porter |
| 4,868,712 A | 9/1989 | Woodman |
| 4,893,174 A | 1/1990 | Yamada et al. |
| 4,894,709 A | 1/1990 | Phillips et al. |
| 4,896,719 A | 1/1990 | O'Neill et al. |
| 4,903,761 A | 2/1990 | Cima |
| 4,908,112 A | 3/1990 | Pace |
| 4,938,280 A | 7/1990 | Clark |
| 4,978,638 A | 12/1990 | Buller et al. |
| 5,009,760 A | 4/1991 | Zare et al. |
| 5,016,090 A | 5/1991 | Galyon et al. |
| 5,016,138 A | 5/1991 | Woodman |
| 5,043,797 A | 8/1991 | Lopes |
| 5,057,908 A | 10/1991 | Weber |
| 5,070,040 A | 12/1991 | Pankove |
| 5,083,194 A | 1/1992 | Bartilson |
| 5,088,005 A | 2/1992 | Ciaccio |
| 5,096,388 A | 3/1992 | Weinberg |
| 5,099,311 A | 3/1992 | Bonde et al. |
| 5,099,910 A | 3/1992 | Walpole et al. |
| 5,125,451 A | 6/1992 | Matthews |
| 5,131,233 A | 7/1992 | Cray et al. |
| 5,142,970 A | 9/1992 | ErkenBrack .................. 99/472 |
| 5,145,001 A | 9/1992 | Valenzuela .................. 165/164 |
| 5,161,089 A | 11/1992 | Chu et al. |
| 5,179,500 A | 1/1993 | Koubek et al. |
| 5,203,401 A | 4/1993 | Hamburgen et al. |
| 5,218,515 A | 6/1993 | Bernhardt |
| 5,219,278 A | 6/1993 | Van Lintel |
| 5,228,502 A | 7/1993 | Chu et al. |
| 5,232,047 A | 8/1993 | Matthews |
| 5,239,200 A | 8/1993 | Messina et al. |
| 5,239,443 A | 8/1993 | Fahey et al. |
| 5,263,251 A | 11/1993 | Matthews |
| 5,265,670 A | 11/1993 | Zingher |
| 5,269,372 A | 12/1993 | Chu et al. |
| 5,274,920 A | 1/1994 | Matthews |
| 5,275,237 A | 1/1994 | Rolfson et al. |
| 5,308,429 A | 5/1994 | Bradley |
| 5,309,319 A | 5/1994 | Messina |
| 5,310,440 A | 5/1994 | Zingher |
| 5,316,077 A | 5/1994 | Reichard |
| 5,317,805 A | 6/1994 | Hoopman et al. |
| 5,325,265 A | 6/1994 | Turlik et al. |
| 5,336,062 A | 8/1994 | Richter |
| 5,346,000 A | 9/1994 | Schlitt |
| 5,371,529 A | 12/1994 | Eguchi et al. |
| 5,380,956 A | 1/1995 | Loo et al. |
| 5,383,340 A | 1/1995 | Larson et al. |
| 5,386,143 A | 1/1995 | Fitch |
| 5,388,635 A | 2/1995 | Gruber et al. |
| 5,397,919 A | 3/1995 | Tata et al. |
| 5,421,943 A | 6/1995 | Tam et al. |
| 5,427,174 A | 6/1995 | Lomolino, Sr. et al. |
| 5,436,793 A | 7/1995 | Sanwo et al. |
| 5,441,613 A | 8/1995 | McCormick et al. |
| 5,459,099 A | 10/1995 | Hsu |
| 5,490,117 A | 2/1996 | Oda et al. |
| 5,508,234 A | 4/1996 | Dusablon, Sr. et al. |
| 5,514,832 A | 5/1996 | Dusablon, Sr. et al. |
| 5,514,906 A | 5/1996 | Love et al. |
| 5,534,471 A | 7/1996 | Carolan et al. |
| 5,544,696 A | 8/1996 | Leland |
| 5,548,605 A | 8/1996 | Benett et al. |
| 5,564,497 A | 10/1996 | Fukuoka et al. ............ 165/152 |
| 5,575,929 A | 11/1996 | Yu et al. |
| 5,585,069 A | 12/1996 | Zanzucchi et al. |
| 5,632,876 A | 5/1997 | Zanzucchi et al. |
| 5,641,400 A | 6/1997 | Kaltenbach et al. |
| 5,658,831 A | 8/1997 | Layton et al. |
| 5,675,473 A | 10/1997 | McDunn et al. |
| 5,685,966 A | 11/1997 | Aaron et al. ................ 204/600 |
| 5,692,558 A | 12/1997 | Hamilton et al. |
| 5,696,405 A | 12/1997 | Weld |
| 5,703,536 A | 12/1997 | Davis et al. |
| 5,704,416 A | 1/1998 | Larson et al. |
| 5,727,618 A | 3/1998 | Mundinger et al. |
| 5,740,013 A | 4/1998 | Roesner et al. |
| 5,759,014 A | 6/1998 | Van Lintel |
| 5,763,951 A | 6/1998 | Hamilton et al. |
| 5,768,104 A | 6/1998 | Salmonson et al. |
| 5,774,779 A | 6/1998 | Tuchinskiy |
| 5,800,690 A | 9/1998 | Chow et al. |
| 5,801,442 A | 9/1998 | Hamilton et al. |
| 5,810,077 A | 9/1998 | Nakamura et al. .......... 165/153 |
| 5,835,345 A | 11/1998 | Staskus et al. |
| 5,836,750 A | 11/1998 | Cabuz |
| 5,839,290 A | 11/1998 | Nazeri |
| 5,858,188 A | 1/1999 | Soane et al. |
| 5,863,708 A | 1/1999 | Zanzucchi et al. |
| 5,870,823 A | 2/1999 | Bezama et al. |
| 5,874,795 A | 2/1999 | Sakamoto |
| 5,876,655 A | 3/1999 | Fisher |
| 5,880,524 A | 3/1999 | Xie |
| 5,886,870 A | 3/1999 | Omori |
| 5,901,037 A | 5/1999 | Hamilton et al. ........... 361/699 |
| 5,921,087 A | 7/1999 | Bhatia et al. |
| 5,936,192 A | 8/1999 | Tauchi |
| 5,940,270 A | 8/1999 | Puckett |
| 5,942,093 A | 8/1999 | Rakestraw et al. |
| 5,945,217 A | 8/1999 | Hanrahan |
| 5,964,092 A | 10/1999 | Tozuka et al. |
| 5,965,001 A | 10/1999 | Chow et al. |
| 5,965,813 A | 10/1999 | Wan et al. |
| 5,978,220 A | 11/1999 | Frey et al. |
| 5,989,402 A | 11/1999 | Chow et al. |
| 5,993,750 A | 11/1999 | Ghosh et al. |
| 5,997,713 A | 12/1999 | Beetz, Jr. et al. |
| 5,998,240 A | 12/1999 | Hamilton et al. |
| 6,007,309 A | 12/1999 | Hartley |
| 6,010,316 A | 1/2000 | Haller et al. |
| 6,012,902 A | 1/2000 | Parce |
| 6,013,164 A | 1/2000 | Paul et al. |
| 6,014,312 A | 1/2000 | Schulz-Harder et al. |
| 6,019,165 A | 2/2000 | Batchelder |
| 6,019,882 A | 2/2000 | Paul et al. |
| 6,021,045 A | 2/2000 | Johnson |
| 6,034,872 A | 3/2000 | Chrysler et al. |
| 6,039,114 A | 3/2000 | Becker et al. |
| 6,054,034 A | 4/2000 | Soane et al. |
| 6,068,752 A | 5/2000 | Dubrow et al. |
| 6,090,251 A | 7/2000 | Sundberg et al. |

| | | | | | | |
|---|---|---|---|---|---|---|
| 6,096,656 | A | 8/2000 | Matzke et al. | 6,495,015 | B1 | 12/2002 | Schoeniger et al. |
| 6,100,541 | A | 8/2000 | Nagle et al. | 6,508,301 | B2 | 1/2003 | Marsala ............... 165/80.4 |
| 6,101,715 | A | 8/2000 | Fuesser et al. | 6,519,151 | B2 | 2/2003 | Chu et al. |
| 6,103,199 | A | 8/2000 | Bjornson et al. ............ 422/100 | 6,533,029 | B1 | 3/2003 | Phillips |
| 6,106,685 | A | 8/2000 | McBride et al. ............ 204/600 | 6,536,516 | B2 | 3/2003 | Davies et al. |
| 6,119,729 | A | 9/2000 | Oberholzer | 6,537,437 | B1 | 3/2003 | Galambos et al. |
| 6,126,723 | A | 10/2000 | Drost et al. | 6,543,521 | B1 | 4/2003 | Sato et al. |
| 6,129,145 | A | 10/2000 | Yamamoto et al. | 6,553,253 | B1 | 4/2003 | Chang |
| 6,129,260 | A | 10/2000 | Andrus et al. | 6,572,749 | B1 | 6/2003 | Paul et al. |
| 6,131,650 | A | 10/2000 | North et al. | 6,578,626 | B1 | 6/2003 | Calaman et al. |
| 6,140,860 | A | 10/2000 | Sandhu et al. | 6,581,388 | B2 | 6/2003 | Novotny et al. |
| 6,146,103 | A | 11/2000 | Lee et al. | 6,587,343 | B2 | 7/2003 | Novotny et al. |
| 6,154,226 | A | 11/2000 | York et al. ............... 346/140.1 | 6,588,498 | B1 | 7/2003 | Reyzin et al. |
| 6,154,363 | A | 11/2000 | Chang | 6,591,625 | B1 | 7/2003 | Simon |
| 6,159,353 | A | 12/2000 | West et al. | 6,600,220 | B2 | 7/2003 | Barber et al. |
| 6,167,948 | B1 | 1/2001 | Thomas | 6,601,643 | B2 | 8/2003 | Cho et al. |
| 6,171,067 | B1 | 1/2001 | Parce | 6,606,251 | B1 | 8/2003 | Kenny et al. |
| 6,174,675 | B1 | 1/2001 | Chow et al. | 6,609,560 | B2 | 8/2003 | Cho et al. |
| 6,176,962 | B1 | 1/2001 | Soane et al. | 6,632,655 | B1 | 10/2003 | Mehta et al. |
| 6,186,660 | B1 | 2/2001 | Kopf-Sill et al. | 6,632,719 | B1 | 10/2003 | DeBoer et al. |
| 6,196,307 | B1 | 3/2001 | Ozmat ..................... 165/185 | 6,651,735 | B2 | 11/2003 | Cho et al. |
| 6,206,022 | B1 | 3/2001 | Tsai et al. | 6,719,535 | B2 | 4/2004 | Rakestraw et al. ........... 417/50 |
| 6,210,986 | B1 | 4/2001 | Arnold et al. | 6,729,383 | B1 | 5/2004 | Cannell et al. |
| 6,216,343 | B1 | 4/2001 | Leland et al. | 6,743,664 | B2 | 6/2004 | Liang et al. |
| 6,221,226 | B1 | 4/2001 | Kopf-Sill | 6,770,183 | B1 | 8/2004 | Hencken et al. |
| 6,227,809 | B1 | 5/2001 | Forster et al. | 2001/0016985 | A1 | 8/2001 | Insley et al. |
| 6,234,240 | B1 | 5/2001 | Cheon | 2001/0024820 | A1 | 9/2001 | Mastromatteo et al. |
| 6,238,538 | B1 | 5/2001 | Parce et al. | 2001/0044155 | A1 | 11/2001 | Paul et al. |
| 6,251,254 | B1 | 6/2001 | Katoh et al. ............... 205/287 | 2001/0045270 | A1 | 11/2001 | Bhatti |
| 6,253,832 | B1 | 7/2001 | Hallefalt | 2001/0046703 | A1 | 11/2001 | Burns et al. |
| 6,253,835 | B1 | 7/2001 | Chu et al. | 2001/0055714 | A1 | 12/2001 | Cettour-Rose et al. |
| 6,257,320 | B1 | 7/2001 | Wargo | 2002/0011330 | A1 | 1/2002 | Insley et al. |
| 6,260,579 | B1 | 7/2001 | Yokota et al. ............. 137/807 | 2002/0075645 | A1 | 6/2002 | Kitano et al. |
| 6,277,257 | B1 | 8/2001 | Paul et al. | 2002/0096312 | A1 | 7/2002 | Korin |
| 6,287,440 | B1 | 9/2001 | Arnold et al. | 2002/0121105 | A1 | 9/2002 | McCarthy, Jr. et al. |
| 6,301,109 | B1 | 10/2001 | Chu et al. | 2002/0134543 | A1 | 9/2002 | Estes et al. |
| 6,313,992 | B1 | 11/2001 | Hildebrandt | 2003/0022505 | A1 | 1/2003 | Ouellet et al. |
| 6,317,326 | B1 | 11/2001 | Vogel et al. | 2003/0062149 | A1 | 4/2003 | Goodson et al. ........ 165/104.11 |
| 6,321,791 | B1 | 11/2001 | Chow | 2003/0121274 | A1 | 7/2003 | Wightman |
| 6,322,753 | B1 | 11/2001 | Lindberg et al. | 2003/0213580 | A1 | 11/2003 | Philpott et al. |
| 6,324,058 | B1 | 11/2001 | Hsiao | 2004/0040695 | A1 | 3/2004 | Chesser et al. |
| 6,330,907 | B1 | 12/2001 | Ogushi et al. | 2004/0052049 | A1 | 3/2004 | Wu et al. |
| 6,336,497 | B1 | 1/2002 | Lin | 2004/0089008 | A1 | 5/2004 | Tilton et al. |
| 6,337,794 | B1 | 1/2002 | Agonafer et al. | 2004/0112571 | A1 | 6/2004 | Kenny et al. ............... 165/80.3 |
| 6,347,036 | B1 | 2/2002 | Yeager et al. | 2004/0120827 | A1 | 6/2004 | Kim et al. |
| 6,351,384 | B1 | 2/2002 | Daikoku et al. | 2004/0125561 | A1 | 7/2004 | Gwin et al. |
| 6,366,462 | B1 | 4/2002 | Chu et al. | 2004/0160741 | A1 | 8/2004 | Moss et al. |
| 6,366,467 | B1 | 4/2002 | Patel et al. | 2004/0188069 | A1 | 9/2004 | Tomioka et al. |
| 6,367,544 | B1 | 4/2002 | Calaman | 2005/0084385 | A1 | 4/2005 | Corbin et al. ................. 417/53 |
| 6,388,317 | B1 | 5/2002 | Reese | 2005/0168949 | A1 | 8/2005 | Tilton et al. ................ 361/699 |
| 6,388,385 | B1 | 5/2002 | McGinn et al. ......... 315/111.91 | | | | |
| 6,396,706 | B1 | 5/2002 | Wohlfarth | | | | |
| 6,397,932 | B1 | 6/2002 | Calaman et al. | | | | |
| 6,400,012 | B1 | 6/2002 | Miller et al. | | | | |
| 6,406,605 | B1 | 6/2002 | Moles | | | | |
| 6,415,860 | B1 | 7/2002 | Kelly et al. | | | | |
| 6,416,642 | B1 | 7/2002 | Alajoki et al. | | | | |
| 6,417,060 | B2 | 7/2002 | Tavkhelidze et al. | | | | |
| 6,424,531 | B1 | 7/2002 | Bhatti et al. | | | | |
| 6,431,260 | B1 | 8/2002 | Agonafer et al. | | | | |
| 6,437,981 | B1 | 8/2002 | Newton et al. | | | | |
| 6,438,984 | B1 | 8/2002 | Novotny et al. | | | | |
| 6,443,222 | B1 | 9/2002 | Yun et al. | | | | |
| 6,443,704 | B1 | 9/2002 | Darabi et al. ................ 417/50 | | | | |
| 6,444,461 | B1 | 9/2002 | Knapp et al. | | | | |
| 6,449,157 | B1 | 9/2002 | Chu | | | | |
| 6,449,162 | B1 | 9/2002 | Corbin, Jr. et al. | | | | |
| 6,457,515 | B1 | 10/2002 | Vafai et al. | | | | |
| 6,459,581 | B1 | 10/2002 | Newton et al. | | | | |
| 6,459,582 | B1 | 10/2002 | Ali et al. | | | | |
| 6,466,442 | B2 | 10/2002 | Lin | | | | |
| 6,477,045 | B1 | 11/2002 | Wang | | | | |
| 6,492,200 | B1 | 12/2002 | Park et al. | | | | |

FOREIGN PATENT DOCUMENTS

| | | |
|---|---|---|
| JP | 2001-326311 | 11/2001 |
| WO | WO 01/25711 A1 | 4/2001 |
| WO | WO 2004/036040 A1 | 4/2004 |
| WO | WO 2004/076857 A3 | 9/2004 |

OTHER PUBLICATIONS

Kendra V. Sharp et al., "Liquid Flows in Microchannels", 2002, vol. 6, pp. 6-1 to 6-38.

Shuchi Shoji et al., "Microflow devices and systems", J. Micromech. Microeng. 4 (1994), pp. 157-171, printed in the U.K.

Angela Rasmussen et al., "Fabrication Techniques to Realize CMOS-Compatible Microfluidic Microchannels", Journal of Microelectromechanical Systems, Vo. 10, No. 2, Jun. 2001, pp. 286-297.

J. H. Wang et al., "Thermal-Hydraulic Characteristic of Micro Heat Exchangers", 1991, DSC-vol. 32, Micromechanical Sensors, Actuators, and Systems, pp. 331-339.

Gad Hetsroni et al., "Nonuniform Temperature Distribution in Electronic Devices Cooled by Flow in Parallel Microchannels", IEEE Transactions on Components and Packaging Technologies, Mar. 2001, vol. 24, No. 1, pp. 16-23.

X. F. Peng et al., "Heat Transfer Characteristics of Water Flowing through Microchannels", Experimental Heat Transfer An International Journal, vol. 7, No. 4, Oct.-Dec. 1994, pp. 265-283.

Linan Jiang et al., "Forced Convection Boiling in a Microchannel Heat Sink", Journal of Microelectromechanical Systems, vol. 10, No. 1, Mar. 2001, pp. 80-87.

Muhammad M. Rahman et al., "Experimental Measurements of Fluid Flow and Heat Transfer in Microchannel Cooling Passages in a Chip Substrate", 1993, EEP-vol. 4-2, Advances in Electronic Packaging, pp. 685-692.

X. F. Peng et al., "Forced convection and flow boiling heat transfer for liquid flowing through Microchannels", 1993, Int. J. Heat Mass Transfer, vol. 36, No. 14, pp. 3421-3427.

Lung-Jieh Yang et al., "A Micro Fluidic System of Micro Channels with On-Site Sensors by Silicon Bulk Micromachining", Sep. 1999, Microfluidic Devices and Systems II, vol. 3877, pp. 267-272.

G. Mohiuddin Mala et al., "Heat transfer and fluid flow in microchannels", 1997, Int. J. Heat Mass transfer, vol. 40, No. 13, pp. 3079-3088, printed in Great Britain.

J. M. Cuta et al., "Fabrication and Testing of Micro-Channel Heat Exchangers", SPIE vol. 2640, 1995, pp. 152-160.

Linan Jiang et al., "A Micro-Channel Heat Sink with Integrated Temperature Sensors for Phase Transition Study", IEEE 1999, pp. 159-164.

Linan Jiang et al., "Fabrication and characterization of a microsystem for a micro-scale heat transfer study", J. Micromech. Microeng. 9 (1999) pp. 422-428, printed in the U.K.

M. B. Bowers et al., "High flux boiling in low flow rate, low pressure drop mini-channel and micro-channel heat sinks", 1994, Int. J. Heat Mass Transfer, vol. 37, No. 2, pp. 321-332.

Yogendra Joshi, "Heat out of small packages", Dec. 2001, Mechanical Engineering, pp. 56-58.

A. Rostami et al., "Liquid Flow and Heat Transfer in Microchannels: A Review", 2000, Heat and Technology, vol. 18, No. 2, pp. 59-68.

Lian Zhang et al., "Measurements and Modeling of Two-Phase Flow in Microchannels with Nearly Constant Heat Flux Boundary Conditions", Journal of Microelectromechanical Systems, vol. 11, No. 1, Feb. 2002, pp. 12-19.

Muhammad Mustafizur Rahman, "Measurements of Heat Transfer in Microchannel Heat Sinks", Int. Comm. Heat Mass Transfer, vol. 27, No. 4, May 2000, pp. 495-506.

Issam Mudawar et al., "Enhancement of Critical Heat Flux from High Power Microelectronic Heat Sources in a Flow Channel", Journal of Electronic Packaging, Sep. 1990, vol. 112, pp. 241-248.

Nelson Kuan, "Experimental Evaluation of Micro Heat Exchangers Fabricated in Silicon", 1996, HTD-vol. 331, National Heat Transfer Conference, vol. 9, pp. 131-136.

E. W. Kreutz et al., "Simulation of micro-channel heat sinks for optoelectronic microsystems", Microelectronics Journal 31(2000), pp. 787-790.

J. C. Y. Koh et al., "Heat Transfer of Microstructures for Integrated Circuits", 1986, Int. Comm. Heat Mass Transfer, vol. 13, pp. 89-98.

Snezana Konecni et al., "Convection Cooling of Microelectronic Chips", 1992, InterSociety Conference on Thermal Phenomena, pp. 138-144.

Michael B. Kleiner et al., "High Performance Forced Air Cooling Scheme Employing Microchannel Heat Exchangers", Dec. 1995, IEEE Transactions on Components, Packaging, and Manufacturing Technology-Part A, vol. 18, No. 4, pp. 795-804.

Jerry K. Keska Ph. D. et al., "An Experimental Study on an Enhanced Microchannel Heat Sink for Microelectronics Applications", EEP-vol. 26-2, Advances in Electronic Packaging, 1999, vol. 2, pp. 1235-1259.

Shung-Wen Kang et al., "The Performance Test and Analysis of Silicon-Based Microchannel Heat Sink", Jul. 1999, Terahertz and Gigahertz Photonics, vol. 3795, pp. 259-270.

Joseph C. Tramontana, "Semiconductor Laser Body Heat Sink", Xerox Disclosure Journal, vol. 10, No. 6, Nov./Dec. 1985, pp. 379-381.

Sarah Arulanandam et al., "Liquid transport in rectangular microchannels by electroosmotic pumping", Colloids and Surfaces A: Physicochemical and Engineering Aspects 161 (2000), pp. 89-102.

Jeffery D. Barner et al., "Thermal Ink Jet Print Head Carriage with Integral Liquid Cooling Capabilities", Xerox Disclosure Journal-vol. 21, No. 1, Jan./Feb. 1996, pp. 33-34.

"Autonomous displacement of a solution in a microchannel by another solution", Research Disclosure, Jun. 2001, pp. 1046-1047.

John M. Waldvogel, "Aluminum Silicon Carbide Phase Change Heat Spreader", Motorola, Jun. 1999, Technical Developments, pp. 226-230.

James P. Slupe et al., "An idea for maintaining a stable thermal environment for electronic devices", Research Disclosure, Aug. 2001, p. 1312.

John M. Waldvogel, "A Heat Transfer Enhancement Method for Forced Convection Bonded-Fin Heatsinks", Motorola, Dec. 1997, Technical Developments, pp. 158-159.

"Thin Heat Pipe for Cooling Components on Printed Circuit Boards", IBM Technical Disclosure Bulletin, vol. 34, No. 7B, Dec. 1991, pp. 321-322.

R. C. Chu et al., "Process for Nucleate Boiling Enhancement", IBM Technical Disclosure Bulletin, vol. 18, No. 7, Dec. 1975, p. 2227.

J. Riseman, "Structure for Cooling by Nucleate Boiling", IBM Technical Disclosure Bulletin, vol. 18, No. 11, Apr. 1976, p. 3700.

"Integrally Grooved Semiconductor Chip and Heat Sink", Oct. 1971, IBM Technical Disclosure Bulletin, vol. 14, No. 5, p. 1425.

"Enhanced Cooling of Thermal Conduction Module", IBM Technical Disclosure Bulletin, vol. 30, No. 5, Oct. 1987, p. 426.

"Heat Exchanger Modules for Data Processor with Valves Operated by Pressure from Cooling Water Pump", IBM Technical Disclosure Bulletin, vol. 30, No. 5, Oct. 1987, p. 419.

"Cold Plate for Thermal Conduction Module with Inlet for Cooling Water Near Highest Power Chips", IBM Technical Disclosure Bulletin, vol. 30, No. 5, Oct. 1987, p. 413.

"Circuit Module Cooling with Coaxial Bellows Providing Inlet, Outlet and Redundant Connections to Water-Cooled Element", IBM Technical Bulletin, vol. 30, No. 5, Oct. 1987, pp. 345-347.

"Piping System with Valves Controlled by Processor for Heating Circuit Modules in a Selected Temperature Profile for Sealing Integrity Test Under Temperature Stress", IBM Technical Disclosure Bulletin, vol. 30, No. 5, Oct. 1987, p. 336.

"Cooling System for Chip Carrier on Card", IBM Technical Disclosure Bulletin, vol. 31, No. 4, Sep. 1988, pp. 39-40.

"Chip Cooling Device", IBM Technical Disclosure Bulletin, vol. 30, No. 9, Feb. 1988, pp. 435-436.

W. E. Ahearn et al., "Silicon Heat Sink Method to Control Integrated Circuit Chip Operating Temperatures", IBM Technical Disclosure Bulletin, vol. 21, No. 8, Jan. 1979, pp. 3378-3380.

N. P. Bailey et al., "Cooling Device for Controlled Rectifier", IBM Technical Disclosure Bulletin, vol. 21, No. 11, Apr. 1979, pp. 4609-4610.

W. J. Kleinfelder et al., "Liquid-Filled Bellows Heat Sink", IBM Technical Disclosure Bulletin, vol. 21, No. 10, Mar. 1979, pp. 4125-4126.

R. P. Chrisfield et al., "Distributed Power/Thermal Control", IBM Technical Disclosure Bulletin, vol. 22, No. 3, Aug. 1979, pp. 1131-1132.

A. J. Arnold et al., "Heat Sink Design for Cooling Modules in a Forced Air Environment", IBM Technical Disclosure Bulletin, vol. 22, No. 6, Nov. 1979, pp. 2297-2298.

A. J. Arnold, "Structure for the Removal of Heat from an Integrated Circuit Module", IBM Technical Disclosure Bulletin, vol. 22, No. 6, Nov. 1979, pp. 2294-2296.

U. P. Hwang et al., "Cold Plate for Thermal Conduction Module with Improved Flow Pattern and Flexible Base", IBM Technical Disclosure Bulletin, vol. 25, No. 9, Feb. 1983, p. 4517.

K. C. Gallagher et al., "Cooling System for Data Processor with Flow Restricter in Secondary Loop to Limit Bypass-Cooling Water Flow", IBM Technical Disclosure Bulletin, vol. 26, No. 5, Oct. 1983, p. 2658.

R. C. Chu et al., "Silicon Heat Sink for Semiconductor Chip", IBM Technical Disclosure Bulletin, vol. 24, No. 11A, Apr. 1982, p. 5743.

J. M. Eldridge et al., "Heat-Pipe Vapor Cooling Etched Silicon Structure", IBM Technical Disclosure Bulletin, vol. 25, No. 8, Jan. 1983, pp. 4118-4119.

J. R. Skobern, "Thermoelectrically Cooled Module", IBM Technical Disclose Bulletin, vol. 27, No. 1A, Jun. 1984, p. 30.

M. J. Brady et al., "Etched Silicon Integrated Circuit Heat Sink", IBM Technical Disclosure Bulletin, vol. 27, No. 1B, Jun. 1984, p. 627.

H. D. Edmonds et al., "Heat Exchange Element for Semiconductor Device Cooling", IBM Technical Disclosure Bulletin, vol. 23, No. 3, Aug. 1980, p. 1057.

R. W. Noth, "Heat Transfer from Silicon Chips and Wafers", IBM Technical Disclosure Bulletin, vol. 17, No. 12, May 1975, p. 3544.

"Forced Boiling Cooling System with Jet Enhancement for Critical Heat Flux Extension", IBM Technical Disclosure Bulletin, vol. 39, No. 10, Oct. 1996, p. 143.

"Miniature Heat Exchanger for Corrosive Media", IBM Technical Disclosure Bulletin, vol. 38, No. 01, Jan. 1995, pp. 55-56.

"Self-Contained Active Heat Dissipation Device", IBM Technical Disclosure Bulletin, vol. 39, No. 04, Apr. 1996, pp. 115-116.

C. J. Keller et al., "Jet Cooling Cup for Cooling Semiconductor Devices", IBM Technical Disclosure Bulletin, vol. 20, No. 9, Feb. 1978, pp. 3575-3576.

B. J. Ronkese, "Centerless Ceramic Package with Directly Connected Heat Sink", IBM Technical Disclosure Bulletin, vol. 20, No. 9, Feb. 1978, p. 3577-3578.

K. S. Sachar, "Liquid Jet Cooling of Integrated Circuit Chips", vol. 20, No. 9, Feb. 1978, pp. 3727-3728.

A. H. Johnson, "Device Cooling", IBM Technical Disclosure Bulletin, vol. 20, No. 10, Mar. 1978, pp. 3919-3920.

R. D. Durand et al., "Flexible Thermal Conductor for Electronic Module", IBM Technical Disclosure Bulletin, vol. 20, No. 11A, Apr. 1978, p. 4343.

D. Balderes et al., "Liquid Cooling of a Multichip Module Package", IBM Technical Disclosure Bulletin, vol. 20, No. 11A, Apr. 1978, pp. 4336-4337.

J. A. Dorler et al., "Temperature Triggerable Fluid Coupling System for cooling Semiconductor Dies", IBM Technical Disclosure Bulletin, vol. 20, No. 11A, Apr. 1978, pp. 4386-4388.

V. W. Antonetti et al., "Integrated Module Heat Exchanger", IBM Technical Disclosure Bulletin, vol. 20, No. 11A, Apr. 1978, p. 4498.

P. Hwang et al., "Conduction Cooling Module", IBM Technical Disclosure Bulletin, vol. 20, No. 11A, Apr. 1978, pp. 4334-4335.

A. J. Arnold et al., "Electronic Packaging Structure", IBM Technical Disclosure Bulletin, vol. 20, No. 11B, Apr. 1978, pp. 4820-4822.

V. Y. Doo et al., "High Performance Package for Memory", IBM Technical Disclosure Bulletin, vol. 21, No. 2, Jul. 1978, pp. 585-586.

"Multi-Chip Package with Cooling by a Spreader Plate in Contact with a Chip having Cylindrical Holes Mating with an Inverse Frame Providing Water Flow Within its Pins", IBM Technical Disclosure Bulletin, vol. 31, No. 5, Oct. 1988, pp. 141-142.

J. Landrock et al., "Cooling System for Semiconductor Chips", IBM Technical Disclosure Bulletin, vol. 23, No. 4, Sep. 1980, p. 1483.

E. P. Damm, Jr., "Convection Cooling Apparatus", IBM Technical Disclosure Bulletin, vol. 20, No. 7, Dec. 1977, pp. 2755-2756.

"Circuit Package with Circulating Boiling Liquid and Local Heat Exchanger to Limit Vapor in Coolant Outlet", IBM Technical Disclosure Bulletin, vol. 31, No. 12, May 1989, p. 34.

"Circuit Module Cooling with Multiple Pistons Contacting a Heat Spreader/Electrical Buffer Plate in Contact with Chip", IBM Technical Disclosure Bulletin, vol. 31, No. 12, May 1989, p. 5-7.

"TCM-Like Circuit Module with Local Heat Sink Resting on Chip and Chip Separated From Coolant by Bellows with Pins and Deflector Plate Attached to Local Heat Sink and Extending Above Bellows into Region of Coolant Flow", IBM Technical Disclosure Bulletin, vol. 31, No. 11, Apr. 1989, pp. 305-306.

"Water-Cooled Circuit Module with Grooves Forming Water Passages Near Heat-Producing Devices", IBM Technical Disclosure Bulletin, vol. 31, No. 12, May 1989, pp. 49-50.

"Cold Plate for Thermal Conduction Module with Only Peripheral Mounting Bolts, Large Surface Area Fin Inserts and Reduced Water Flow and Thermal Resistances", IBM Technical Disclosure Bulletin, vol. 31, No. 12, May 1989, p. 59.

"Thermal Control Hardware for Accelerated Run-In Testing of Multi-Chip Modules", IBM Technical Disclosure Bulletin, vol. 32, No. 5A, Oct. 1989, p. 129-130.

"Means of Removing More Heat From a TCM (Or Other Liquid-Cooled Logic Package) By Reducing the Coolant Temperature", IBM Technical Disclosure Bulletin, vol. 32, No. 5A, Oct. 1989, pp. 153-154.

E. G. Loeffel et al., "Liquid Cooled Module with Compliant Membrane", IBM Technical Disclosure Bulletin, vol. 20, No. 2, Jul. 1977, pp. 673-674.

V. Y. Doo et al., "Method of Effective Cooling of a High Power Silicon Chip", IBM Technical Disclosure Bulletin, vol. 20, No. 4, Sep. 1977, p. 1436-1437.

V. Y. Doo et al., Semiconductor Chip Cooling Package, IBM Technical Disclosure Bulletin, vol. 20, No. 4, Sep. 1977, pp. 1440-1441.

"Heat Sink Fabrication Method", IBM Technical Disclosure Bulletin, vol. 27, No. 10A, Mar. 1985, p. 5656-5657.

"Thermal Conduction Module with Liquid Dielectric and Pistons with Surface Treatment for Enhanced Nucleate Boiling", IBM Technical Disclosure Bulletin, vol. 27, No. 12, May 1985, p. 6904.

"Pin Fin Array Heat Pipe Apparatus", IBM Technical Disclosure Bulletin, vol. 37, No. 09, Sep. 1994, p. 171.

Youngcheol Joo et al., "Fabrication of Monolithic Microchannels for IC Chip Cooling", 1995, IEEE Micro Electro Mechanical Systems, pp. 362-367.

Jaisree Moorthy et al., "Active control of electroosmotic flow in microchannels using light", Jan. 26, 2001, Sensors and Actuators B 75, pp. 223-229.

Andreas Manz et al., "Electroosmotic pumping and electrophoretic separations for miniaturized chemical analysis systems", Sep. 16, 1994, J.Micromech. Microeng. 4 (1994), pp. 257-265, printed in the U.K.

E. B. Cummings et al., "Irrotationality of uniform electroosmosis", Sep. 1999, Part of the SPIE Conference on Microfluidic Devices and Systems II, SPIE vol. 3877, pp. 180-189.

Haim H. Bau, "Optimization of conduits' shape in micro heat exchangers", Dec. 10, 1997, International Journal of Heat and Mass Transfer 41 (1998), pp. 2717-2723.

V. K. Dwivedi et al., "Fabrication of very smooth walls and bottoms of silicon microchannels for heat dissipation of semiconductor devices", Jan. 25, 2000, Microelectronics Journal 31 (2000), pp. 405-410.

M. B. Bowers et al.,, "Two-Phase Electronic Cooling Using Mini-Channel and Micro-Channel Heat Sinks: Part 2-Flow Rate and Pressure Drop Constraints", Dec. 1994, Journal of Electronic Packaging, vol. 116, pp. 298-305.

Meint J. de Boer et al., "Micromachining of Buried Micro Channels in Silicon", Mar. 2000, Journal of Microelectromechanical systems, vol. 9, No. 1, pp. 94-103.

S.B. Choi et al., "Fluid Flow and Heat Transfer in Microtubes", 1991, DSC-vol. 32, Micromechanical sensors, Actuators, and Systems, ASME 1991, pp. 123-134.

S. F. Choquette, M. Faghri et al., "Optimum Design of Microchannel Heat Sinks", DSC-vol. 59, Microelectromechanical Systems (MEMS), ASME 1996, pp. 115-126.

David Copeland et al., "Manifold Microchannel Heat Sinks: Theory and Experiment", EEP-vol. 10-2, Advances in Electronic Packaging ASME, 1995, pp. 829-835.

J. M. Cuta et al., "Forced Convection Heat Transfer in Parallel Channel Array Microchannel Heat Exchanger", PID-vol. 2 / HTD-vol. 338, Advances in Energy efficiency, Heat/Mass Transfer Enhancement, ASME 1996, pp. 17-23.

K. Fushinobu et al., "Heat Generation and Transport in Sub-Micron Semiconductor Devices", HTD-vol. 253, Heat Transfer on the Microscale, ASME 1993, pp. 21-28.

Charlotte Gillot et al., "Integrated Micro Heat Sink for Power Multichip Module", IEEE Transactions on Industry Applications, vol. 36, No. 1, Jan./Feb. 2000, pp. 217-221.

John Goodling, "Microchannel heat exchangers—a review", SPIE vol. 1997 High Heat Flux Engineering II (1993), pp. 66-82.

Koichiro Kawano et al., "Micro Channel Heat Exchanger for Cooling Electrical Equipment", HTD-vol. 361-3/PID-vol. 3, Proceedings of the ASME Heat Transfer Division—vol. 3, ASME 1998, pp. 173-188.

Chad Harris et al., "Design and Fabrication of a Cross Flow Micro Heat Exchanger", Dec. 2000, Journal of Microelectromechanical Systems, vol. 9, No. 4, pp. 502-508.

George M. Harpole et al., "Micro-Channel Heat Exchanger Optimization", 1991, Seventh IEEE SEMI-THERM Symposium, pp. 59-63.

Pei-Xue Jiang et al., "Thermal-hydraulic performance of small scale micro-channel and porous-media heat-exchangers", International Journal of Heat and Mass Transfer 44 (2001), pp. 1039-1051.

X.N. Jiang et al., "Laminar Flow Through Microchannels Used for Microscale Cooling Systems", 1997, IEEE/CPMT Electronic Packaging Technology Conference, pp. 119-122.

David Bazeley Tuckerman, "Heat-Transfer Microstructures for Integrated Circuits", Feb. 1984, pp. ii-xix, pp. 1-141.

M Esashi, "Silicon micromachining for integrated microsystems", Vacuum/vol. 47/Nos. 6-8/1996, pp. 469-474.

T.S. Ravigururajan et al., "Effects of Heat Flux on Two-Phase Flow Characteristics of Refrigerant Flows in a Micro-Channel Heat Exchanger", HTD-vol. 329, National Heat Transfer Conference, vol. 7, ASME 1996, pp. 167-178.

T.S. Ravigrururajan et al., "Single-Phase Flow Thermal Performance Characteristics of a Parallel Micro-Channel Heat Exchanger", HTD-vol. 329, National Heat Transfer Conference, vol. 7, ASME 1996, pp. 157-166.

T.S. Ravigururajan et al., "Liquid Flow Characteristics in a Diamond-Pattern Micro-Heat-Exchanger", DSC-vol. 59 Microelectromechanical Systems (MEMS), ASME 1996, pp. 159-166.

T.S. Ravigururajan, "Impact of Channel Geometry on Two-Phase Flow Heat Transfer Characteristics of Refrigerants in Microchannel Heat Exchangers", May 1998, Journal of Heat Transfer, vol. 120, pp. 485-491.

J. Pfahler et al., "Liquid Transport in Micron and Submicron Channels", Mar. 1990, Sensors and Actuators, A21-A23 (1990), pp. 431-434.

Kenneth Pettigrew et al., "Performance of a MEMS based Micro Capillary Pumped Loop for Chip-Level Temperature Control", 2001, The 14$^{th}$ IEEE International Conference on Micro Electro Mechanical Systems, pp. 427-430.

C. Perret et al., "Microchannel integrated heat sinks in silicon technology", The 1998 IEEE Industry Applications Conference, pp. 1051-1055.

X.F. Peng et al., "Convective heat transfer and flow friction for water flow in microchannel structures", 1996, Int. J. Heat Mass Transfer, vol. 39, No. 12, pp. 2599-2608, printed in Great Britain.

X.F. Peng et al., "Experimental investigation of heat transfer in flat plates with rectangular microchannels", 1994, Int. J. Heat Mass Transfer, vol. 38, No. 1, pp. 127-137, printed in Great Britain.

X.F. Peng et al., "Cooling Characteristics with Microchanneled Structures", 1994, Enhanced Heat Transfer, vol. 1, No. 4, pp. 315-326, printed in the United States of America.

X.F. Peng et al., "Enhancing the Critical Heat Flux Using Microchanneled Surfaces", 1998, Enhanced Heat Transfer, vol. 5, pp. 165-176, Printed in India.

Yoichi Murakami et al., "Parametric Optimization of Multichanneled Heat Sinks for VLSI Chip Cooling", Mar. 2001, IEEE Transactions on Components and Packaging Technologies, vol. 24, No. 1, pp. 2-9.

D. Mundinger et al., "High average power 2-D laser diode arrays on silicon microchannel coolers", CLEO '89/Friday Morning/404.

L.J. Missaggia et al., "Microchannel Heat Sinks for Two-Dimensional High-Power-Density Diode Laser Arrays", IEEE Journal of Quantum Electronics, vol. 25, No. 9, Sep. 1989, pp. 1988-1992.

M.J. Marongiu et al., "Enhancement of Multichip Modules (MCMs) Cooling by Incorporating MicroHeatPipes and Other High Thermal Conductivity Materials into Microchannel Heat Sinks", 1998, Electronic Components and Technology Conference, pp. 45-50.

C.R. Friedrich et al., "Micro heat exchangers fabricated by diamond machining", Jan. 1994, Precision Engineering, vol. 16, No. 1, pp. 56-59.

Mali Mahalingam, "Thermal Management in Semiconductor Device Packaging", Proceedings of the IEEE, vol. 73, No. 9, Sep. 1985, pp. 1396-1404.

T.M. Adams et al., "An experimental investigation of single-phase forced convection in microchannels", 1997, Int. J. Heat Mass Transfer, vol. 41, Nos. 6-7, pp. 851-857, Printed in Great Britain.

T.M. Adams et al., "Applicability of traditional turbulent single-phase forced convection correlations to non-circular microchannels", Int. J. Heat and Transfer 42 (1999), pp. 4411-4415.

Bassam Badran et al., "Experimental Results for Low-Temperature Silicon Micromachined Micro Heat Pipe Arrays Using Water and Methanol as Working Fluids", May 31, 1997, Experimental Heat Transfer, 10: pp. 253-272.

D. Jed Harrison et al., "Electroosmotic Pumping Within A Chemical Sensor System Integrated on Silicon", Session C9 Chemical Sensors and Systems for Liquids, Jun. 26, 1991, pp. 792-795.

Kurt Seiler et al., "Electroosmotic Pumping and Valveless Control of Fluid Flow within a Manifold of Capillaries on a Glass Chip", 1994, Analytical Chemistry, vol. 66, No. 20, Oct. 15, 1994, pp. 3485-3491.

Philip H. Paul et al., "Electrokinetic Generation of High Pressures Using Porous Microstructures", 1998, Micro-Total Analysis Systems, pp. 49-52.

Gh. Mohiuddin Mala et al., "Flow characteristics of water through a microchannel between two parallel plates with electrokinetic effects", Oct. 1997, Int. J. Heat and Fluid Flow, vol. 18, No. 5, pp. 489-496.

W.E. Morf et al., "Partial electroosmotic pumping in complex capillary systems Part 1: Principles and general theoretical approach", Oct. 16, 2000, Sensors and Actuators B 72 (2001), pp. 266-272.

M. Esashi, "Silicon micromachining and micromachines", Wear, vol. 168, No. 1-2, (1993), pp. 181-187.

Stephanus Buttgenbach et al., "Microflow devices for miniaturized chemical analysis systems", Nov. 1998, SPIE-Chemical Microsensors and Applications, vol. 3539, pp. 51-61.

Sarah Arulanandam et al., "Liquid transport in rectangular microchannels by electroosmotic pumping", Colloids and Surfaces A: Physicochemical and Engineering Aspects, vol. 161 (2000), pp. 89-102.

Linan Jiang et al., "Closed-Loop Electroosmotic Microchannel Cooling System for VLSI Circuits", Mechanical Engineering Dept. Stanford University, pp. 1-27.

Susan L. R. Barker et al., "Fabrication, Derivatization and Applications of Plastic Microfluidic Devices", Proceedings of SPIE, vol. 4205, 2001, pp. 112-118.

Timothy E. McKnight et al., "Electroosmotically Induced Hydraulic Pumping with Integrated Electrodes on Microfluidic Devices", Aug. 15, 2001, Anal. Chem., vol. 73, No. 16, pp. 4045-4049.

Chris Bourne, "Cool Chips plc Receives Nanotech Manufacturing Patent", Jul. 31, 2002, pp. 1-2.

Frank Wagner et al., "Electroosmotic Flow Control in Micro Channels Produced by Scanning Excimer Laser Ablation", Proceedings of SPIE vol. 4088, 2000, pp. 337-340.

H. A. Goodman, "Data Processor Cooling With Connection To Maintain Flow Through Standby Pump", Dec. 1983, IBM Technical Disclosure Bulletin, vol. 26, No. 7A, p. 3325.

"Electroerosion Micropump", May 1990, IBM Technical Disclosure Bulletin, vol. 32, No. 12, pp. 342-343.

Shulin Zeng et al., "Fabrication and Characterization of Electrokinetic Micro Pumps", 2000 Inter Society Conference on Thermal Phenomena, pp. 31-35.

A. Manz et al., "Integrated Electroosmotic Pumps and Flow Manifolds for Total Chemical Analysis Systems", 1991, Inter. Conf. on Solid-State Sensors and Actuators, pp. 939-941.

O. T. Guenat et al., "Partial electroosmotic pumping in complex capillary systems Part: 2 Fabrication and application of a micro total analysis system suited for continuous volumetric nanotitrations", Sensors and Actuators B 72 (2001) pp. 273-282.

J. G. Sunderland, "Electrokinetic dewatering and thickening. I. Introduction and historical review of electrokinetic applications", Feb. 1987, Journal of Applied Electrochemistry, vol. 17, No. 5, pp. 889-898.

J. C. Rife et al., "Acousto- and electroosmotic microfluidic controllers", Sep. 1998, Microfluidic Devices and Systems, vol. 3515, pp. 125-135.

Pumendu K Dasgupta et al., "Electroosmosis: A Reliable Fluid Propulsion System for Flow Injection Analysis", Jun. 1994, Anal. Chem., vol. 66, No. 11, pp. 1792-1798.

Ray Beach et al., "Modular Microchannel Cooled Heatsinks for High Average Power Laser Diode Arrays", Apr. 1992, IEEE Journal of Quantum Electronics, vol. 28, No. 4, pp. 966-976.

Roy W. Knight et al., "Optimal Thermal Design of Air cooled Forced Convection Finned Heat Sinks—Experimental Verification", Oct. 1992, IEEE Transactions on Components, Hybrids, and Manufacturing Technology, vol. 15, No. 5, pp. 754-760.

Y. Zhuang et al., "Experimental study on local heat transfer with liquid impingement flow in two-dimensional micro-channels", 1997, Int. J. Heat Mass Transfer, vol. 40, No. 17, pp. 4055-4059.

D. Yu et al., "An Experimental and Theoretical Investigation of Fluid Flow and Heat Transfer in Microtubes", 1995, ASME / JSME Thermal Engineering Conference, vol. 1, pp. 523-530.

Xiaoqing Yin et al., "Micro Heat Exchangers Consisting of Pin Arrays", Journal of Electronic Packaging, Mar. 1997, vol. 119, pp. 51-57.

X. Yin et al., "Uniform Channel Micro Heat Exchangers", Journal of Electronic Packaging, Jun. 1997, vol. 119, pp. 89-94.

Chun Yang et al., "Modeling forced liquid convection in rectangular microchannels with electrokinetic effects", International Journal of Heat and Mass Transfer 41 (1998), pp. 4229-4249.

Arel Weisberg et al., "Analysis of microchannels for integrated cooling", 1992, Int. J. Heat Mass Transfer, vol. 35, No. 10, pp. 2465-2473.

Roger S. Stanley et al., "Two-Phase Flow in Microchannels", 1997, DSC-vol. 62/HTD-vol. 354, MEMS, pp. 143-152.

B. X. Wang et al., "Experimental investigation on liquid forced-convection heat transfer through microchannels", 1994, Int. J. Heat Mass Transfer, vol. 37, Suppl. 1, pp. 73-82.

Kambiz Vafai et al., "Analysis of two-layered micro-channel heat sink concept in electronic cooling", Int. J. Heat Mass Transfer, 42 (1999), pp. 2287-2297.

Gokturk Tunc et al., "Heat transfer in rectangular microchannels", Int. J. Heat Mass Transfer, 45 (2002), pp. 765-773.

D. B. Tuckerman et al., "High-Performance Heat Sinking for VLSI", May 1981, IEEE Electron Device Letters, vol. EDL-2, No. 5, pp. 126-129.

Bengt Sunden et al., "An Overview of Fabrication Methods and Fluid Flow and Heat Transfer Characteristics of Micro Channels", pp. 3-23.

David S. Shen et al., "Micro Heat Spreader Enhanced Heat Transfer in MCMs", 1995, IEEE Multi-Chip Module Conference, pp. 189-194.

S. Sasaki et al., "Optimal Structure for Microgrooved Cooling Fin for High-Power LSI Devices", Electronic Letters, Dec. 4, 1986, vol. 22, No. 25.

Vijay K. Samalam, "Convective Heat Transfer in Microchannels", 1989, Journal of Electronic Materials, vol. 18, No. 5, pp. 611-617.

Sanjay K. Roy et al., "A Very High Heat Flux Microchannel Heat Exchanger for Cooling of Semiconductor Laser Diode Arrays", May 1996, IEEE Transactions on components, packaging, and manufacturing technology-part B, vol. 19, No. 2, pp. 444-451.

Charlotte Gillot et al., "Integrated Single and Two-Phase Micro Heat Sinks Under IGBT Chips", IEEE Transactions on Components and Packaging Technology, vol. 22, No. 3, Sep. 1999, pp. 384-389.

A.L. Pascuzzo et al., "Integrated Circuit Module Package Cooling Structure", IBM, vol. 20, No. 10, Mar. 1978, pp. 3898-3899.

H. Krumm, "Chip Cooling", IBM Technical Disclosure Bulletin, vol. 20, No. 7, Dec. 1977, p. 2728.

Jae-Mo Koo et al., "Modeling of Two-Phase Microchannel Heat Sinks for VLSI Chips", Mech. Eng. Depart. of Stanford University, pp. 422-426.

REMEDIES TO PREVENT CRACKING IN A LIQUID SYSTEM

RELATED APPLICATION

This patent application is a divisonal of U.S. patent application Ser. No. 10/643,641 filed Aug. 18, 2003 and entitled "REMEDIES TO PREVENT CRACKING IN A LIQUID SYSTEM."

This application claims priority under 35 U.S.C. § 119(e) of the co-pending U.S. provisional patent application Ser. No. 60/444,269, filed on Jan. 31, 2003, and titled "REMEDIES FOR FREEZING IN CLOSED-LOOP LIQUID COOLING FOR ELECTRONIC DEVICES." The provisional patent application Ser. No. 60/444,269, filed on Jan. 31, 2003, and titled "REMEDIES FOR FREEZING IN CLOSED-LOOP LIQUID COOLING FOR ELECTRONIC DEVICES" is hereby incorporated by reference.

FIELD OF THE INVENTION

The present invention relates to an apparatus and method of preventing cracking of a liquid system, such as may be useful for transferring heat from electronic devices and components thereof. In particular, the invention utilizes a variety of means and objects to protect against expansion of water-based solutions when frozen.

BACKGROUND OF THE INVENTION

When water or many other fluid mixtures are cooled below freezing, the material changes from a liquid state to a solid state, and undergoes a significant expansion in volume, which is as much as 10% or more for water or water-based mixtures. When water freezes in a pipe, it undergoes a similar expansion. Water that has frozen in pipes or other confined spaces does more than simply clog the pipes and block flow. When freezing occurs in a confined space like a steel pipe, the ice will expand and exert extreme pressure which is often enough to crack the pipe and cause serious damage. This phenomenon is a common failure mode in hot-water heating systems and automotive cooling systems.

Ice forming in a pipe does not always cause cracking where ice blockage occurs. Rather, following a complete ice blockage in a pipe, continued freezing and expansion inside the pipe can cause water pressure to increase downstream. The increase in water pressure leads to pipe failure and/or cracking. Upstream from the ice blockage the water can retreat back towards its inlet source, and there is little pressure buildup to cause cracking.

Liquid cooling systems for electronic devices are occasionally subjected to sub-freezing environments during shipping, storage, or in use. Since these systems are going to be frozen on occasion, they must be designed to tolerate the expansion of water when frozen. Additives, such as anti-freeze, are potentially poisonous and flammable and can damage mechanical components, sensitive sensors, and electronics, which is why pure or substantially pure water is typically the coolant of choice.

What is needed is an apparatus for and method of preventing cracking in a liquid cooling system that can tolerate a predetermined level of freezing and expansion inside confined spaces without damaging electronic components or affecting system performance.

SUMMARY OF THE INVENTION

A liquid system utilizing size and volume reducing means, air pockets, compressible objects, and flexible objects is provided to protect against expansion of water-based solutions when frozen. In such a system, pipes, pumps, and heat exchangers are designed to prevent cracking of their enclosures and chambers.

In a first aspect of the invention, an apparatus for preventing cracking of a liquid system is disclosed. The apparatus comprises at least one heat exchanger; one or more inlet ports extending through a first opening for conveying a fluid to a plurality of channels and passages; one or more outlet ports extending through a second opening for discharging the fluid from the plurality of channels and passages; and one or more compressible objects positioned substantially adjacent the inlet ports and the outlet ports in an unpressured condition such that the compressible objects reduce a volume of the inlet ports and the outlet ports and further wherein pressure exerted on the compressible objects increases a volume of the inlet ports and the outlet ports.

The compressible objects can preferably accommodate a predetermined level of fluid expansion. The predetermined level of fluid expansion can be between 5 to 25 percent. The compressible objects are preferably capable of contracting and expanding between a minimum volume and a maximum volume. The compressible objects can be secured within the inlet port and the outlet port. Alternatively, the compressible objects can be positioned at any location throughout the system. The compressible objects can be made of sponge, foam, air-filled bubbles, balloons and encapsulated in a hermetically sealed package. The package can be made of metallic material, metallized plastic sheet material, or plastic material. The plastic materials can be selected from teflon, mylar, nylon, PET, PVC, PEN or any other suitable package.

In a second aspect of the invention, an apparatus for preventing cracking of a liquid system is disclosed. The apparatus comprises at least one heat exchanger having a top element and a bottom element; a plurality of channels and passages formed within the bottom element to provide flow of a fluid therethrough; and one or more compressible objects positioned within one or more of the plurality of channels and passages such that in an uncompressed state the compressible objects reduce a volume of each of the plurality of channels and passages having one or more of the compressible objects and further wherein under pressure exerted within the channels and passages the compressible objects are compressed to increase the volume of each of the plurality of channels and passages.

In a further separate aspect of the invention, an apparatus for preventing cracking of a liquid system is provided. The system preferably includes one or more pumps and one or more heat exchangers. The apparatus comprises an enclosure, wherein a size and volume occupied by fluid within the enclosure is minimized. The pump can be an electro-osmotic pump.

The enclosure is preferably capable of contracting and expanding between a minimum size and volume condition and a maximum size and volume condition.

In a second separate aspect of the invention, an apparatus for preventing cracking of a liquid system is disclosed. The apparatus comprises a housing having at least one inlet chamber and at least one outlet chamber, wherein a size and volume occupied by fluid within the inlet and outlet chambers is minimized.

The inlet and outlet chambers are preferably capable of contracting and expanding between a minimum size and volume condition and a maximum size and volume condition. The inlet and outlet chambers can be separated by a pumping structure or mechanism.

In a further separate aspect of the invention, a method of preventing cracking of a liquid system is disclosed. The system includes at least one pump and at least one heat exchanger. The method comprises the steps of providing an enclosure and minimizing a size and volume occupied by fluid within the enclosure.

In a further aspect of the invention, a method of preventing cracking of a liquid system is disclosed. The method comprises the steps of providing a housing having at least one inlet chamber and at least one outlet chamber; and minimizing a size and volume occupied by fluid within the inlet and outlet chambers.

In a further aspect of invention, an apparatus for preventing cracking of a liquid system is provided. The system includes at least one pump and at least one heat exchanger. The apparatus comprises an enclosure and one or more compressible objects immersed in the enclosure.

The objects preferably accommodate a predetermined level of fluid expansion. The predetermined level of fluid expansion is preferably between 5 to 25 percent. The objects preferably have a size and volume proportion to an amount of fluid in the enclosure. The objects can be a hydrophobic foam. Alternatively, the objects can be hydrophobic sponges. Also, the objects can be balloons in hydrophobic bags. The objects can be made of rubber, plastic, foam, sealed foam or rubber, or vacuum laminated foam or rubber. The objects may be enclosed in vacuum laminated bags.

In a further aspect of the invention, an apparatus for preventing cracking of a liquid system is provided. The apparatus comprises a housing having at least one inlet chamber and at least one outlet chamber and one or more compressible objects immersed in the inlet and outlet chambers. The objects preferably have a size and volume proportional to an amount of fluid in the chambers.

In a further aspect of the invention, a method of preventing cracking of a liquid system is disclosed. The method comprises the steps of providing an enclosure and immersing one or more compressible objects in the enclosure.

In a further aspect of the invention, a method of preventing cracking of a liquid system is disclosed. The method comprises the steps of providing a housing having at least one inlet chamber and at least one outlet chamber and immersing one or more compressible objects in the inlet and outlet chambers.

In a further aspect of the invention, an apparatus for preventing cracking of a liquid system is disclosed. The apparatus comprises an enclosure and one or more air pockets disposed in the enclosure. The air pockets are preferably positioned farthest away from a location where liquid begins to freeze in the enclosure.

The air pockets preferably have a volume proportional to an amount of fluid in the enclosure. The air pockets preferably accommodate a predetermined level of fluid expansion. The predetermined level of fluid expansion is preferably between 5 to 25 percent.

In a further aspect of the invention, an apparatus for preventing cracking of a liquid system is disclosed. The apparatus comprises a housing having at least one inlet chamber and at least one outlet chamber and an one or more air pockets disposed in the inlet and outlet chambers. The air pockets are preferably positioned farthest away from a location where liquid begins to freeze in the chambers. The air pockets preferably have a volume proportion to an amount of fluid in the chambers.

In a further aspect of the invention, a method of preventing cracking of a liquid system is provided. The method comprises the steps of providing an enclosure and disposing one or more air pockets in the enclosure. The air pockets are positioned farthest away from a location where liquid begins to freeze in the enclosure.

In a further aspect of the invention, a method of preventing cracking of a liquid system is disclosed. The method comprises the steps of providing a housing having at least one inlet chamber and at least one outlet chamber and disposing one or more air pockets in the inlet and outlet chambers. The air pockets are positioned farthest away from a location where liquid begins to freeze in the chambers.

In a further aspect of the invention, an apparatus for preventing cracking of a liquid system is provided. The apparatus comprises an enclosure for holding liquid having a plurality of walls and at least one flexible object coupled to form a portion of at least one wall of the enclosure such that pressure exerted on the flexible objects increases a volume of the enclosure.

The flexible objects preferably accommodate a predetermined level of fluid expansion. The flexible objects can be spaced apart a predetermined distance. The flexible objects are preferably capable of contracting and expanding between a minimum volume condition and a maximum volume condition. The flexible objects are preferably secured within the enclosure and deformable under pressure. The flexible objects can be made of rubber. Alternatively, the flexible objects can be made of plastic or foam.

In a further aspect of the invention, an apparatus for preventing cracking of a liquid system is provided. The apparatus comprises a housing having at least one inlet chamber and at least one outlet chamber and at least one flexible object coupled to form a portion of at least one of the inlet and outlet chambers such that pressure exerted on the flexible objects increases a volume of the housing. The flexible objects preferably accommodate a predetermined level of fluid expansion. In a further aspect of the invention, a method of preventing cracking of a liquid system is disclosed. The method comprises the steps of providing an enclosure and disposing at least one flexible object to form a portion of at least one wall of the enclosure such that pressure exerted on the flexible objects increases a volume of the enclosure. The flexible objects preferably accommodate a predetermined level of fluid expansion.

In a further aspect of the invention, a method of preventing cracking of a liquid system is disclosed. The method comprises the steps of providing a housing having at least one inlet chamber and at least one outlet chamber and disposing at least one flexible object to form a portion of at least one of the inlet and outlet chambers such that pressure exerted on the flexible objects increases a volume of the housing. The flexible objects preferably accommodate a predetermined level of fluid expansion.

DETAILED DESCRIPTION OF THE PREFERRED EMBODIMENT

Reference will now be made in detail to the preferred and alternative embodiments of the invention, examples of which are illustrated in the accompanying drawings. While the invention will be described in conjunction with the preferred embodiments, it will be understood that they are not intended to limit the invention to these embodiments. On the contrary, the invention is intended to cover alternatives, modifications and equivalents, which may be included within the spirit and scope of the invention as defined by the appended claims. Furthermore, in the following detailed description of the present invention, numerous specific details are set forth in order to provide a thorough understanding of the present invention. However, it should be noted that the present invention may be practiced without these specific details. In other instances, well known methods, procedures and components have not been described in detail as not to unnecessarily obscure aspects of the present invention.

Figure 1:
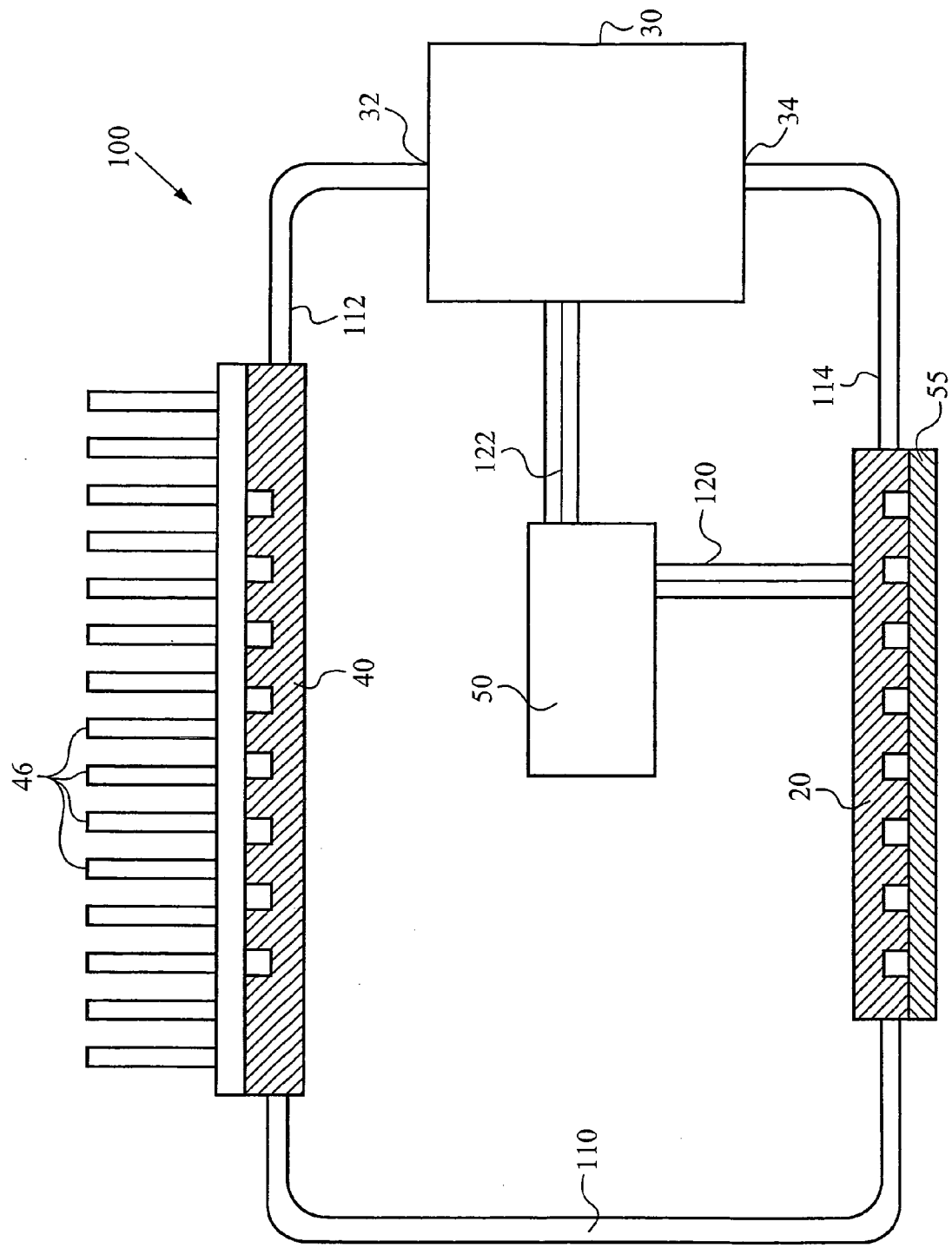
FIG. 1 illustrates a schematic diagram of a conventional closed-loop cooling system, which includes an electro-osmotic pump and a heat exchanger.

FIG. 1 shows a schematic diagram of a closed-loop cooling system 100, which includes heat exchanger 20 attached to a heat producing device 55 (shown as an integrated circuit attached to a circuit board, but which could also be a circuit board or other heat producing device), a pump 30 for circulating fluid, a heat rejector 40, which may include a plurality of fins 46 for further assisting in conducting heat away from the system 100, and a controller 50 for a pump input voltage based on a temperature measured at the heat exchanger 20. Fluid flows from an inlet 32, is pulled through a porous structure (not shown) within the pump 30 by electroosmotic forces, and exits through the outlet 34. While the preferred embodiment uses an electroosmotic pump, it will be understood that the present invention can be implemented in a system using other types of pumps.

Still referring to FIG. 1, the fluid travels through the heat exchanger 20 and the heat rejector 40 through tubing lengths 114 and 110 before being recycled back to the inlet 32 of the pump 30 via another tubing 112. The controller 50 is understood to be an electronic circuit that takes input signals from thermometers in the heat exchanger 20, or from thermometers in the device 55 being cooled, which signals are transmitted along signal lines 120. The controller 50, based upon the input signals regulates flow through the pump 30 by applying signals to a power supply (not shown) associated with the pump 30 along signal lines 122 to achieve the desired thermal performance.

As fluid temperature drops below freezing, ice forms into a blockage. Continued growth of ice in areas of the system 100 can lead to excessive fluid pressure. The resulting pressure can rupture or damage individual elements, such as the lengths 110, 112, 114 of tubing, channels in the heat exchangers 20 and 40, and/or chambers inside the pump 30. As will be explained and understood in further detail below, the individual elements must be designed in a way that tolerates expansion of the fluid or water when frozen.

Figure 2:
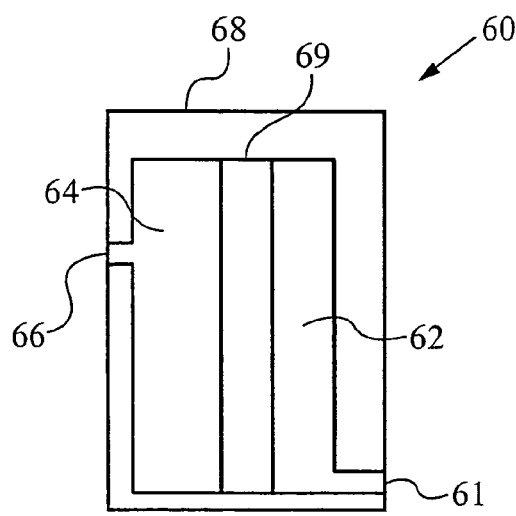
FIG. 2 illustrates a schematic diagram of a housing having an inlet chamber and an outlet chamber.

In one embodiment, shown in FIG. 2, an apparatus or pump 60 includes a housing 68 having an inlet chamber 62 and an outlet chamber 64. A pumping mechanism or structure 69 separates the inlet and outlet chambers 62 and 64 from a bottom surface of the housing 68 to an upper surface of the housing 68. The pumping structure 69 channels liquid from a pump inlet 61 to a pump outlet 66. The chambers 62 and 64 are filled with fluid. Preferably, the liquid used in the pump 60 is water. It is contemplated that any other suitable liquid is contemplated in accordance with the present invention.

Still referring to FIG. 2, the pump 60 can be designed so that there are no large pockets of water in any of the chambers 62 and 64. Since water expands as it freezes, ice takes up more room than liquid. When freezing occurs in confined spaces, such as chambers 62 and 64, displacement caused by the expansion of fluids is proportional to an amount of fluid volume in the chambers 62 and 64. Minimizing the size and volume occupied by the chambers 62 and 64 reduces the displacement, and thereby prevents bending, stretching, or cracking of the chambers 62 and 64.

Figure 3:
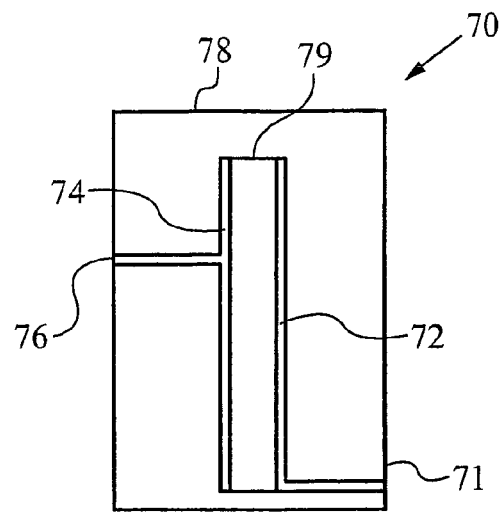
FIG. 3 illustrates a schematic diagram of a housing having inlet and outlet chambers reduced in size and volume in accordance with the present invention.

As shown in FIG. 3, the volume of inlet and outlet chambers 72 and 74 is substantially reduced compared to the chambers 62 and 64 in FIG. 2. As such, the amount of water present in the pump 70 is greatly reduced. Detailed mechanical analysis of the chambers 72 and 74 is required, but the chambers 72 and 74 can be designed to withstand force exerted by frozen water. The inlet and outlet chambers 72 and 74 can be capable of contracting and expanding between a minimum size and volume condition and a maximum size and volume condition. It should be understood that the tubing lengths 110, 112, and 114 in FIG. 1 can be reduced in size and volume to reduce displacement caused by fluid expansion in areas of the system 100 (FIG. 1).

Figure 4:
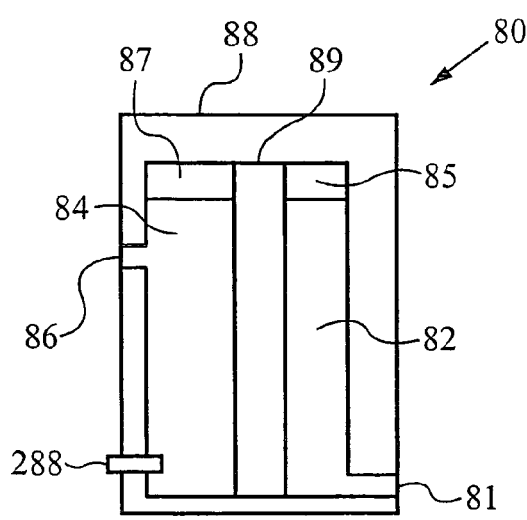
FIG. 4 illustrates a schematic diagram of an air pocket disposed in an inlet chamber and an outlet chamber of a housing in accordance with the present invention.

In another embodiment, as shown in FIG. 4, an apparatus or pump 80 includes a housing 88 having an inlet chamber 82 and an outlet chamber 84. A pumping structure 89 separates the inlet and outlet chambers 82 and 84 from a bottom surface of the housing 88 to an upper surface of the housing 88. The pumping structure 89 channels liquid from a pump inlet 81 to a pump outlet 86. The chambers 82 and 84 are filled with fluid to a large extent. Preferably, the liquid used in the pump 80 is water. It is contemplated that any other suitable liquid is contemplated in accordance with the present invention.

Still referring to FIG. 4, air pockets 85 and 87 are disposed in the inlet and outlet chambers 82 and 84. The air pockets 85 and 87 are preferably positioned farthest away from a location where fluid begins to freeze in the chambers 82 and 84. Expansion of the ice upon freezing in the chambers 82 and 84 will take up some space occupied by the air pockets 85 and 87, and a cause a slight increase of pressure in the chambers 82 and 84. However, air is compressible enough that it can be significantly compressed with relatively small forces, such that the expansion of the ice is easily accommodated. Preferably, the air pockets 85 and 87 have a volume proportion to an amount of fluid in the chambers 82 and 84. The air pockets 85 and 87 can preferably accommodate a predetermined level of fluid expansion between five to twenty five percent.

As mentioned before, ice forming in a confined space does not typically cause a break where initial ice blockage occurs. Rather, following a complete ice blockage in a confined space, continued freezing and expansion inside the confined space cause fluid pressure to increase downstream. The fluid pressure will reach a maximum at a last location to freeze in a hermetically sealed system. The pressure can be very large, unless there is a trapped air pocket in that region. Thermal design of the chambers 82 and 84 can be altered to select a location where the fluid begins to freeze, and to arrange for freezing to start from one location and advance continuously towards an air pocket at another location. For example, if there is an air pocket at the top surface of a chamber, the fluid should be nucleated at the bottom surface of the chamber. As the fluid begins to freeze at the bottom surface of the chamber, ice expansion displaces water and compresses the air pocket. Since air is easily compressible, the chamber can freeze completely without generating large forces at any location in the chamber.

To arrange a location of initial freezing in the chamber, it may be necessary to provide a thermal path from the location of initial freezing to its surroundings. As the fluid or chamber is cooled from above a freezing point, the thermal path serves to efficiently reject heat stored in the location. For example, an optional metallic insert 288 is mounted from the location of initial freezing in the chamber to the top surface of the chamber would serve. Preferably, the metallic insert 288 is formed of a material that will not contaminate the fluid such as copper. Alternatively, reducing the size and volume of the chamber or reducing package insulation in the chamber could also work. A critical factor is use of any material or structure that assists a particular location become cold fastest, and so that progression of freezing is continuous from that location to the air pockets 85 and 87 of FIG. 4.

Figure 5:
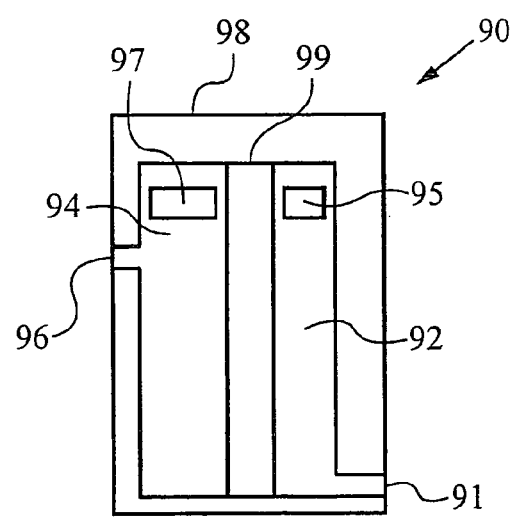
FIG. 5 illustrates a schematic diagram of a compressible object disposed in an inlet chamber and an outlet chamber of a housing in accordance with the present invention.

In some cases, it may be difficult to control the positioning and location of the air pockets 85 and 87 in the chambers 82 and 84. Further, it may be difficult to dispose an air pocket in each chamber of the system 100 (FIG. 1). In a further embodiment, as shown in FIG. 5, one or more compressible objectss 95 and 97 are immersed in pump 90. The pump 90 includes a housing 98 having an inlet chamber 92 and an outlet chamber 94. A pumping structure 99 separates the inlet and outlet chambers 92 and 94 from a bottom surface of the housing 98 to an upper surface of the housing 98. The pumping structure 99 channels liquid from a pump inlet 91 to a pump outlet 96. The chambers 92 and 94 are filled with fluid to a large extent. Preferably, the liquid used in the pump 90 is water. It is contemplated that any other suitable liquid is contemplated in accordance with the present invention.

Still referring to FIG. 5, the one or more compressible objectss 95 and 97 are immersed and coupled to inlet and outlet chambers 92 and 94. The objects 95 and 97 can be a hydrophobic foam or sponge. Preferably, the objects 95 and 97 accommodate a predetermined level of fluid expansion between five to twenty five percent. To accommodate the fluid expansion, the objects 95 and 97 can preferably have a size and volume proportional to an amount of fluid in the chambers 92 and 94.

The objects 95 and 97 can be comprised of a compressible material, such as an open-cell or closed-cell foam, rubber, sponge, air-filled bubbles, elastomer, or any related material, and a protective layer covering all surfaces of the compressible material. A purpose of having the protective layer is to prevent contact between the compressible material and a surrounding fluid. The protective layer can be formed by many means, including wrapping and sealing, dip-coating, spray-coating, or other similar means. The protective layer can be a vacuum laminated cover, such as a spray-on layer, a deposited layer, or a layer formed by reacting or heating surfaces of the compressible material. In addition, it is possible to form a protective layer on the surface of the compressible material by thermally fusing, melting, or chemically modifying the surface. The protective layer can be flexible enough so that a volume of the compressible material can be reduced by pressure. In order to achieve this degree of flexibility, the protective layer can be much thinner than the compressible material. Further, the protective layer can be formed from a material that is not chemically attacked by the fluid used in the cooling system, or degraded by temperature cycles above and below freezing. The protective layer can be hermetically sealed so that gas cannot enter or leave the volume within the protective layer. The protective layer can be formed from a variety of materials, including teflon, mylar, polyethylene, nylon, PET, PVC, PEN or any other suitable plastic, and can additionally include metal films on interior or exterior surfaces to improve hermeticity. In addition, the protective layer can be a metallized plastic sheet material, as used in potato chip packaging, and can serve as an impervious layer, blocking all gas and liquid diffusion. Furthermore, in cases where occasional bubbles are moving through the cooling system, as when an electroosmotic pump is generating hydrogen and oxygen gas bubbles, the protective layer can be hydrophilic to help reduce the possibility that the bubbles will attach to the surfaces.

Figure 6A:
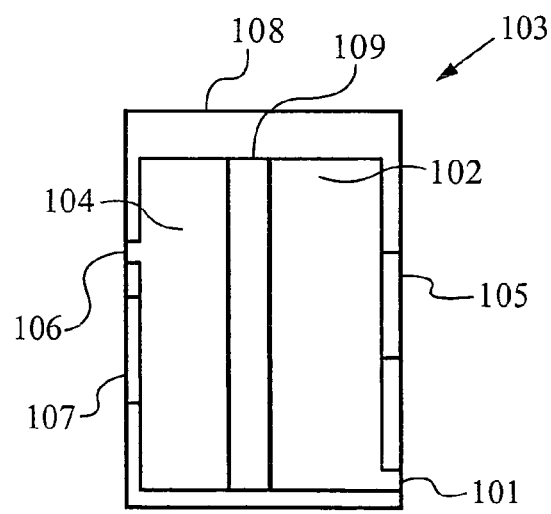
FIG. 6A illustrates a schematic diagram of a housing having inlet and outlet chambers and a plurality of spaced apart flexible objects coupled to the chambers.
Figure 6B:
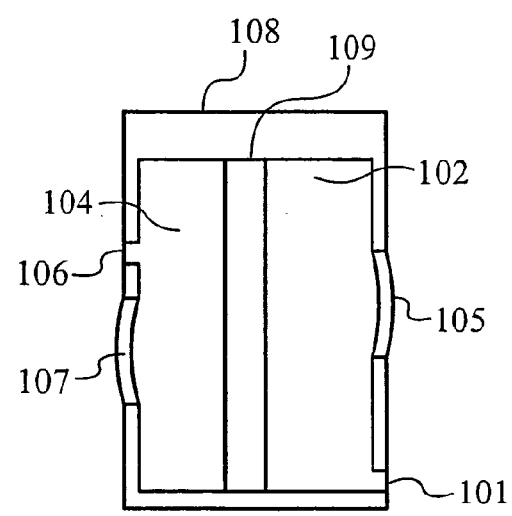
FIG. 6B illustrates a schematic diagram of a housing having inlet and outlet chambers and a plurality of spaced flexible objects coupled to the chambers, the flexible objects being displaced during fluid expansion to prevent cracking.

In a further embodiment, as shown in FIG. 6A, an apparatus or pump 103 includes a housing 108 having an inlet chamber 102 and an outlet chamber 104. A pumping structure 109 separates the inlet and outlet chambers 102 and 104 from a bottom surface of the housing 108 to an upper surface of the housing 108. The pumping structure 109 channels liquid from a pump inlet 101 to a pump outlet 106. The chambers 102 and 104 are filled with fluid to a large extent. Preferably, the liquid used in the pump 103 is water. It is contemplated that any other suitable liquid is contemplated in accordance with the present invention.

Still referring to FIG. 6A, a plurality of spaced apart flexible objects 105 and 107 are coupled to the inlet and outlet chambers 102 and 104. In this embodiment, the flexible objects 105 and 107 are preferably constructed from a flexible material, such as rubber or plastic. The flexible material is preferably designed and arranged such that it can be partially displaced to accommodate expansion of ice without cracking itself or other rigid elements of the inlet and outlet chambers 102 and 104. Preferably, the flexible objects 105 and 107 accommodate a predetermined level of fluid expansion between five to twenty five percent. The flexible objects can be spaced apart from one another a predetermined distance. Preferably, the flexible objects 105 and 107 are capable of contracting and expanding between a minimum volume condition and a maximum volume condition. Alternatively, the flexible objects 105 and 107 are secured within the chambers 102 and 104.

Figure 7A:
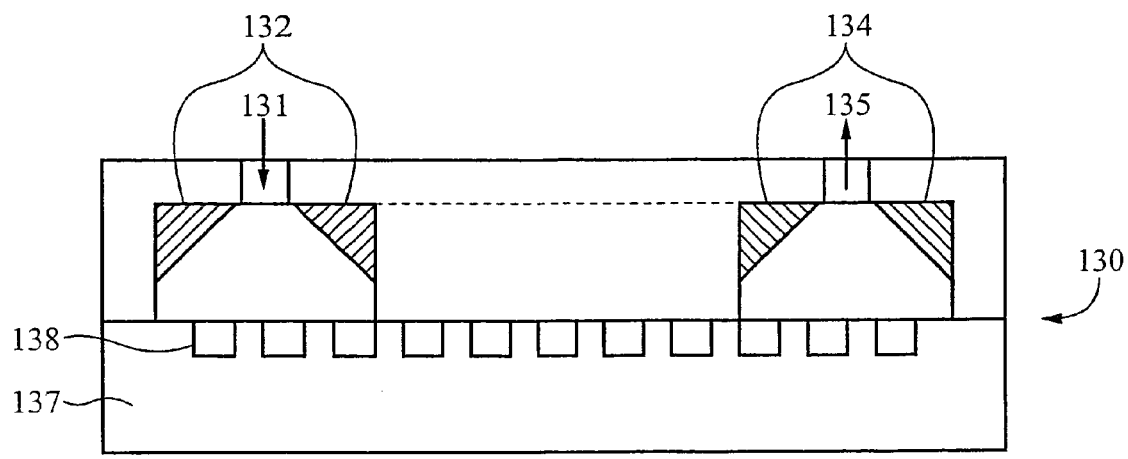
FIG. 7A illustrates a schematic diagram of compressible objects coupled to inlet and outlet ports within a heat exchanger.

FIG. 7A illustrates a schematic diagram of compressible objects 132 and 134 coupled to inlet and outlet ports 131 and 135 within a heat exchanger 130. Fluid generally flows from one or more inlet ports 131 and flows along a bottom surface 137 in microchannels 138 of any configuration and exits through the outlet port 135, as shown by arrows. The compressible objects 132 and 134 are preferably designed and arranged such that it can be partially displaced to accommodate expansion of ice without cracking itself or other rigid elements of the inlet and outlet ports 131 and 135 in FIG. 7A.

Figure 7B:
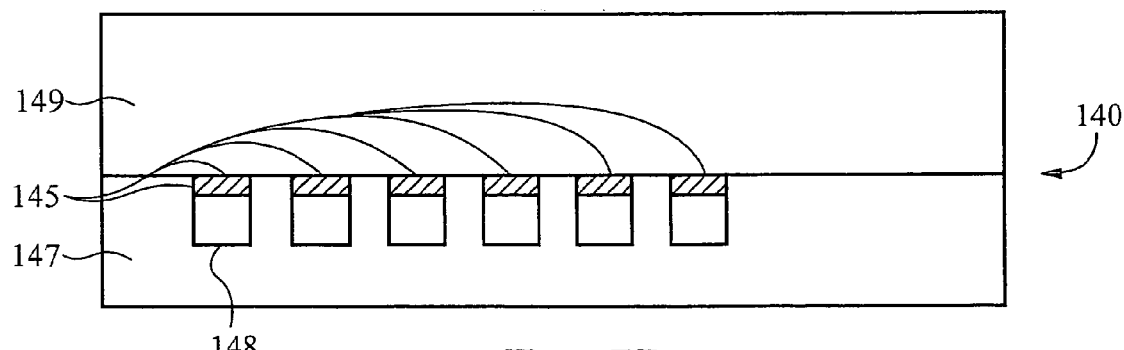
FIG. 7B illustrates a schematic diagram of compressible objects disposed along a bottom surface of a heat exchanger within adjacent microchannels.
Figure 8A:
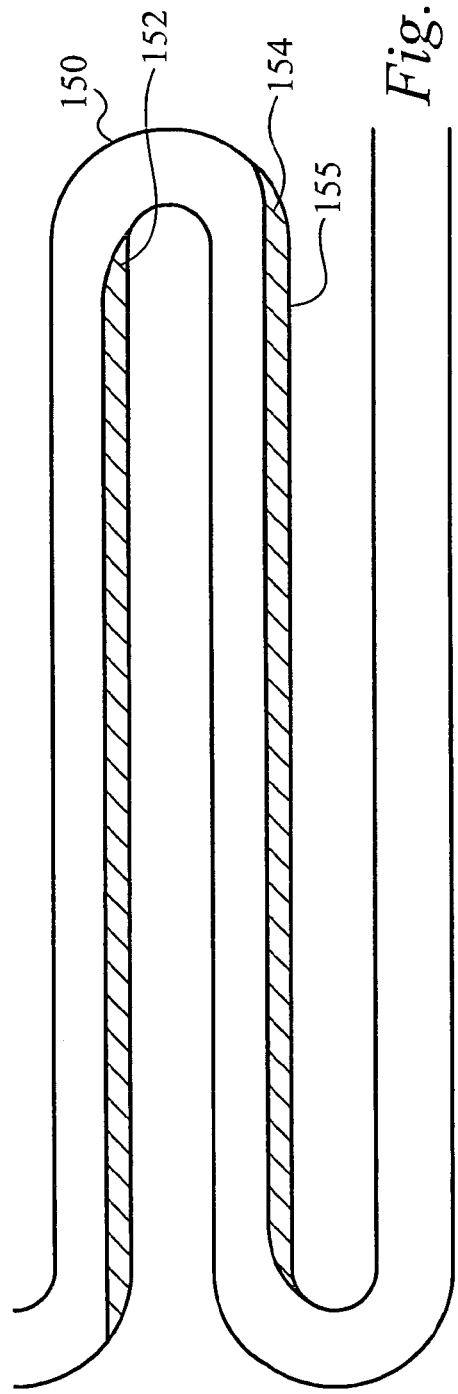
FIG. 8A illustrates a schematic diagram of compressible objects coupled to walls of fluid filled tubing within a heat rejector.

FIG. 7B illustrates a schematic diagram of compressible objects 145 disposed along a bottom surface 147 of a heat exchanger 140 within microchannels 148. As shown in FIG. 7B, the compressible objects 145 can be arranged within the microchannels 148 such that the compressible objects 145 form part of a seal from a top surface 149 to the bottom surface 147. In both FIGS. 7A and 7B, compressible objects act as freeze protection within a heat exchanger. The positioning of the compressible objects 145 is intended to minimize flow resistance, and to avoid degrading heat transfer from the bottom surface 147 to the fluid. Placement of the compressible objects 145 on sides of the microchannels is also possible, although less advantageous than the positioning as shown in FIG. 8A. Positioning on the bottom surface 148 would severely degrade performance of the heat exchanger 140 because of a high thermal resistance of the compressible objects 145.

Figure 8B:
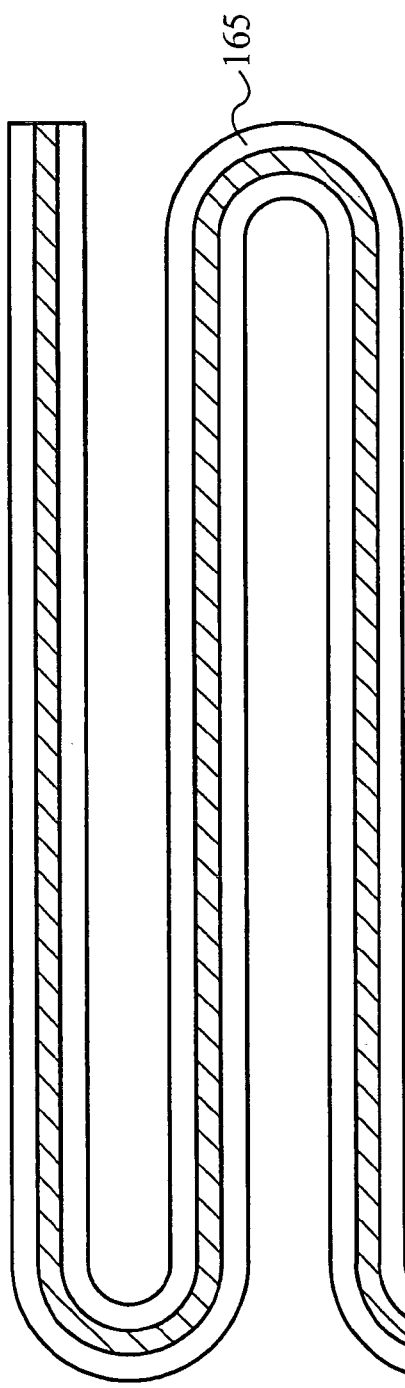
FIG. 8B illustrates a schematic diagram of compressible objects disposed along a length of fluid filled tubing within a heat rejector.

FIG. 8A illustrates a schematic diagram of compressible objects 152 and 154 coupled to walls 151 and 155 of fluid filled tubing 150 within a heat rejector. The tubing 150 can be substantially longer than other portions of the system, for example centimeters in length in certain parts of the system 100 (FIG. 1), and as much as a meters in length in other parts. Placement of a length of the compressible objects 152 and 154 to the walls 151 and 155 of the tubing 150 will act as freeze protection within a heat rejector. Alternatively, as shown in FIG. 8B, compressible element 165, such as compressible foam structures, can be threaded along a length of the tubing 160. The compressible element 165 can float freely within the tubing 160. Because the compressible element 165 is thinner than the tubing 160, it can simply be threaded without concern for forming a blockage in the tubing 160. A length of the compressible elements 165 will vary according to the lengths of the tubing 160.

Figure 9:
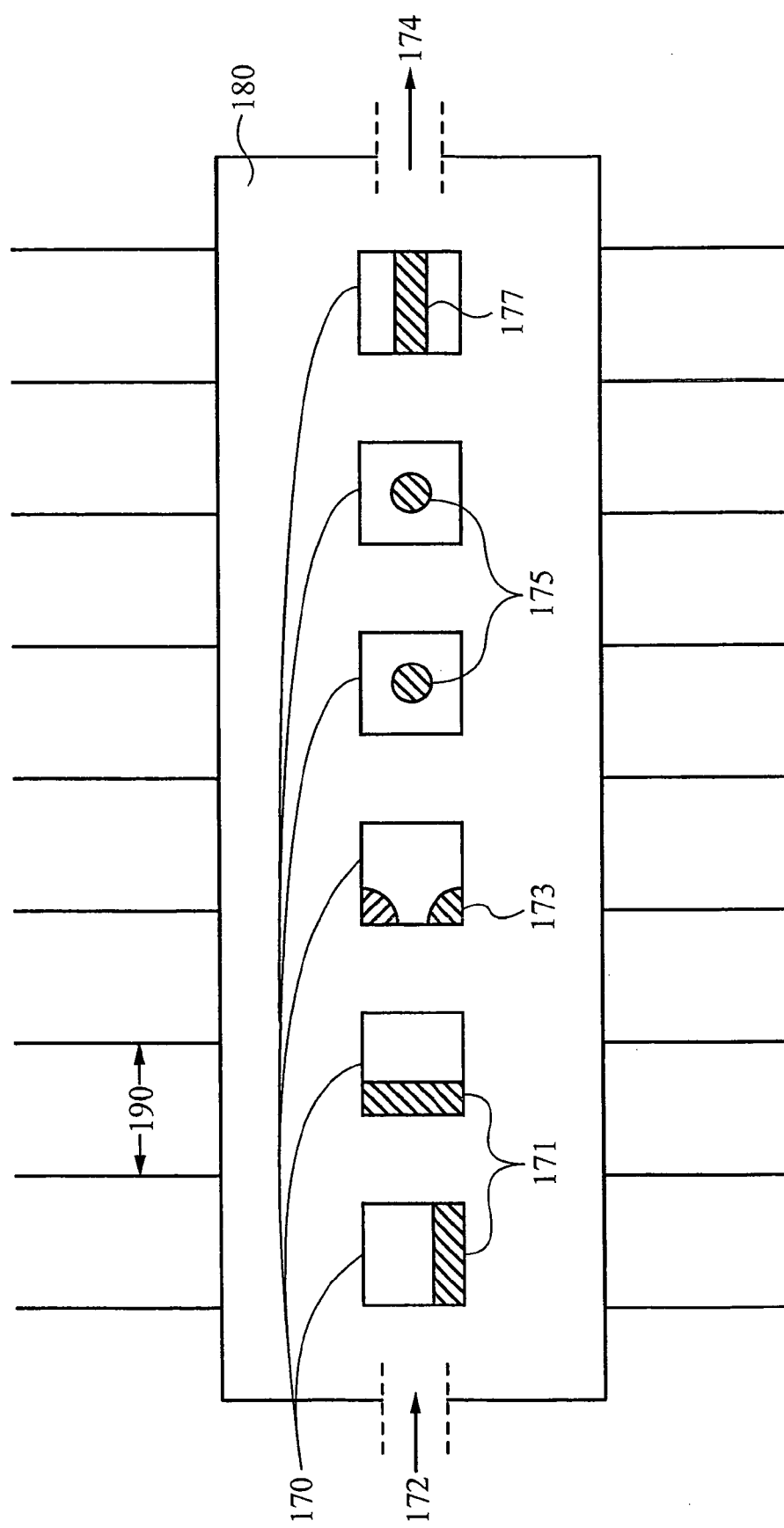
FIG. 9 illustrates a schematic diagram of compressible objects disposed within fluid filled channels of a plate within a heat rejector.

FIG. 9 illustrates a schematic diagram of various possible configurations for compressible objects 171, 173, 175 and 177 disposed within fluid filled channels 170 of a plate 180 within a heat rejector. As shown in FIG. 9, fluid can be routed through the channels 170 disposed within the plate 180 that allows fluid flow between a fluid inlet 172 and a fluid outlet 174. A heat rejector can include fins 190 mounted to and in thermal contact with the plate 180. The compressible objects 171, 173, 175 and 177 disposed within the channels 170 provide freeze protection, thereby improving performance of the entire system.

Figure 10:
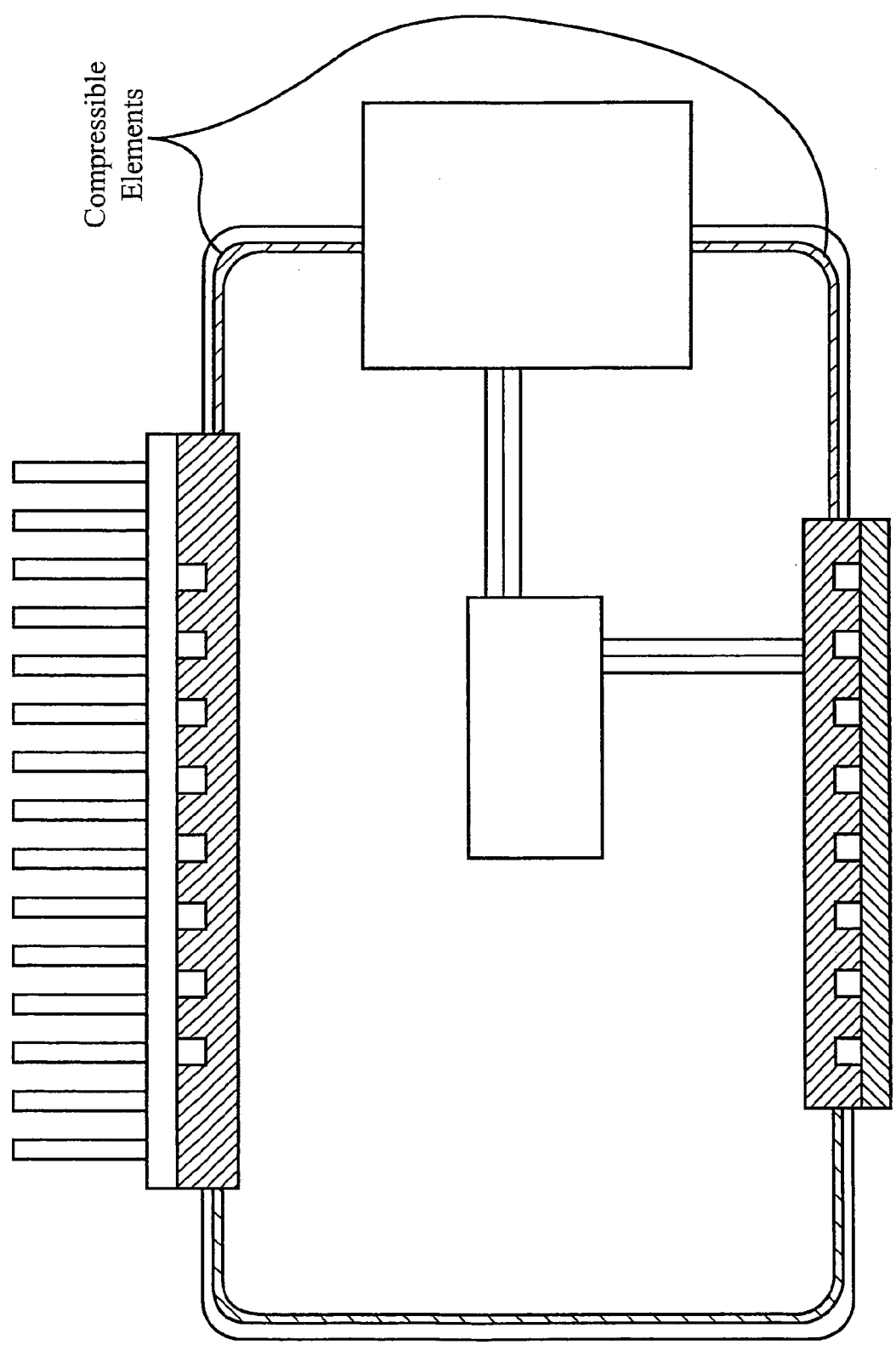
FIG. 10 illustrates a schematic diagram of compressible objects disposed in fluid segments of a cooling loop.

In addition to the use of size and volume reducing means, air pockets, compressible objects, and compressible objects discussed above, other techniques can be used to prevent cracking in a liquid cooling system, as would be recognized by one of ordinary skill in the art. For example, as shown in FIG. 10, compressible elements can partly fill all fluid segments of a cooling loop. In all these cases, it will be appreciated by one of ordinary skill that routine mechanical design analysis is useful to compute stress throughout the cooling system including but not limited to the chambers, lengths of tubing, and other enclosures that contain either the air pockets and compressible objects to design a system for which that stresses do not accumulate in any location in sizes large enough to cause the enclosures to fail. In a closed-loop cooling system for an electronic device, relatively large reservoirs of fluid are likely to be in the chambers of the pump or the tubing in a heat exchanger. System design should strive to eliminate these volumes of fluid, thereby reducing the reservoirs at their source. Failing that, or if large volumes of fluid are needed to guarantee sufficient fluid over extended use, the embodiments described above can reduce forces generated during freezing to manageable levels.

Figure 11:
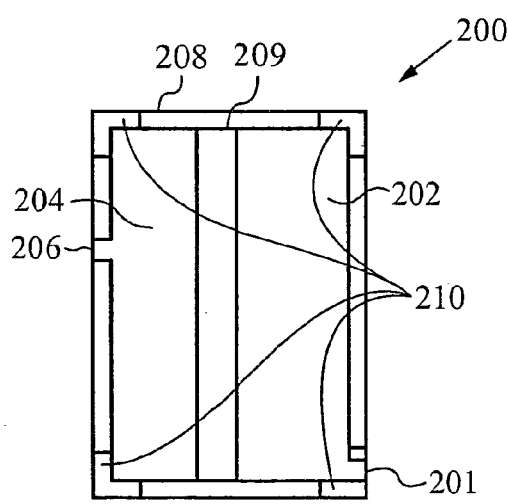
FIG. 11 illustrates a schematic diagram of a housing having an inlet chamber and an outlet chamber and a plurality of spaced apart flexible objects coupled to the chambers.

In another embodiment, shown in FIG. 11, an apparatus or pump 200 includes a housing 208 having an inlet chamber 202 and an outlet chamber 204. A pumping structure 209 separates the inlet and outlet chambers 202 and 204 from a bottom surface of the housing 208 to an upper surface of the housing 208. The pumping structure 209 channels liquid from a pump inlet 201 to a pump outlet 206. The chambers 202 and 204 are filled with fluid. Preferably, the liquid used in the pump 200 is water. It is contemplated that any other suitable liquid is contemplated in accordance with the present invention.

Figure 12:
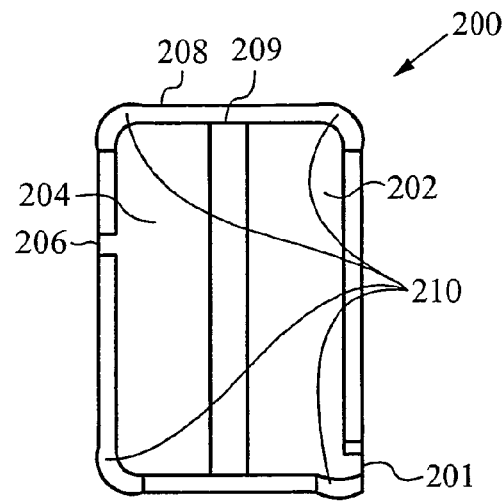
FIG. 12 illustrates a schematic diagram of a housing having inlet and outlet chambers and a plurality of spaced apart flexible objects coupled to the chambers, the flexible objects being displaced during fluid expansion to prevent cracking.

Still referring to FIG. 11, the housing 208 can be designed to withstand expansion of the fluid when freezing occurs. A plurality of flexible objects 210 are coupled to at least one wall of the housing 208. The housing 208 consists of rigid plates and support the chambers 202 and 204. The plates make tip a plurality of sides of the chambers 202 and 204 and are joined by the flexible objects 210. The flexible objects 210 can be fastened to the plates. The flexible objects 210 can be formed on any or each of the plurality of sides of the chambers 202 and 204, which includes corner edges, and allow the plates to be displaced outward when acted upon by force, as shown in FIG. 12. The flexible objects can be elastomer hinges or any suitable polymer hinge, so long as it can alter its shape when met by force.

Figure 13:
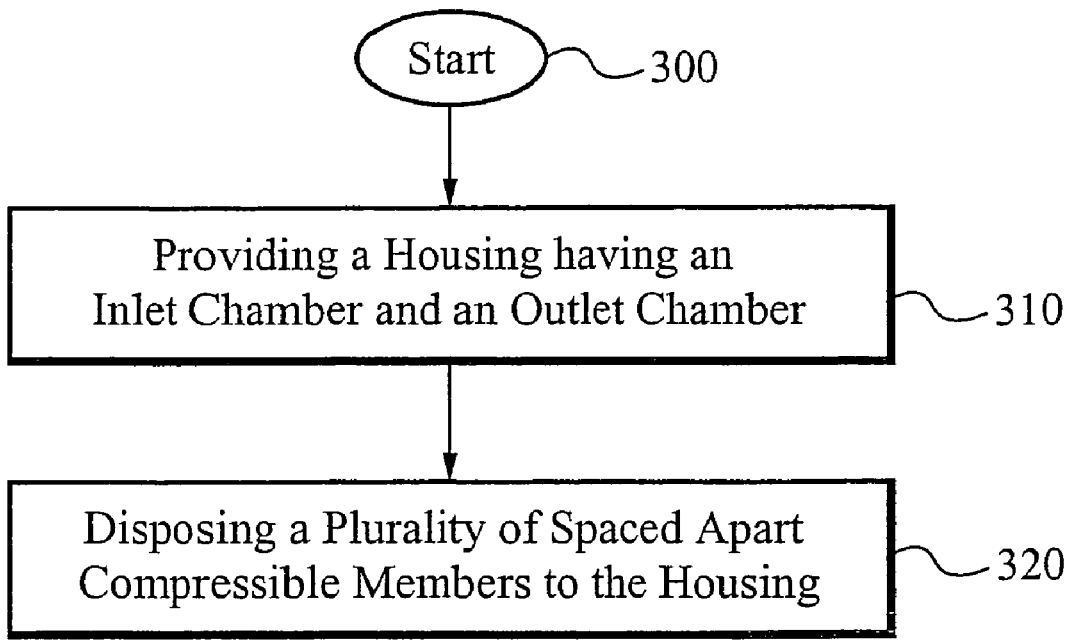
FIG. 13 illustrates a flow chart illustrating steps of a preferred method of one embodiment of the present invention.

In an alternative embodiment, as shown in FIG. 13, a method of preventing cracking in a pump is disclosed beginning in the Step 300. In the Step 310, a housing is provided having an inlet chamber and an outlet chamber separated by a pumping structure. In the Step 320, a plurality of spaced apart flexible objects are disposed form at least one wall of the housing such that pressure exerted on the plurality of spaced apart flexible objects increases a volume of the housing. The flexible objects can accommodate a predetermined level of fluid expansion.

The predetermined level of fluid can be between five to twenty five percent. The flexible objects are preferably spaced apart a predetermined distance. Additionally, the flexible objects are preferably capable of contracting and expanding between a minimum volume condition and a maximum volume condition. The pump can be electro-osmotic. The housing can include rigid plates. Furthermore, the flexible objects can be fastened to the rigid plates. The flexible objects can be made of rubber, plastic or foam.

Figure 14:
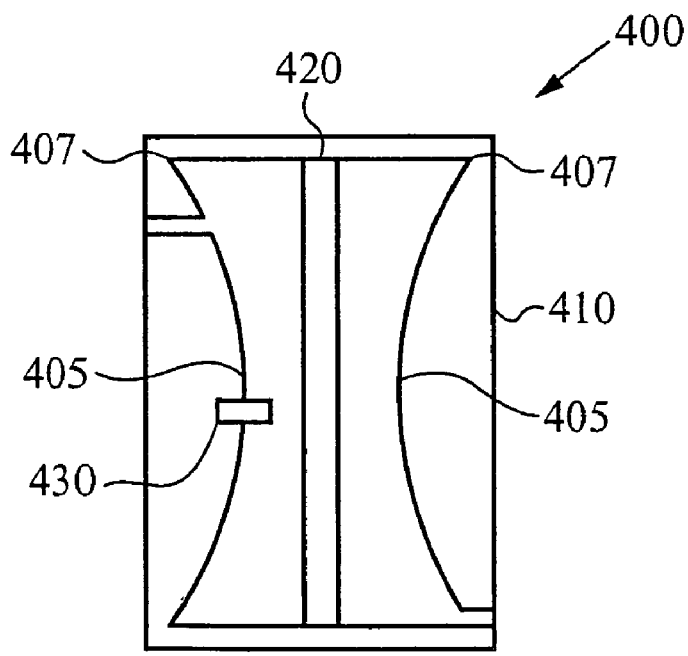
FIG. 14 illustrates a schematic diagram of a housing having inlet and outlet chambers having a relatively narrowed central portion and substantially identical expanded end portions.

In another embodiment, shown in FIG. 14, an apparatus or pump 400 includes a housing 410 having hourglass-shaped inlet and outlet chambers. The hourglass-shaped chambers can have a relatively narrowed middle or central portion 405 and substantially identical expanded end portions 407. A pumping structure 420 separates the inlet and outlet chambers from a bottom surface of the housing 410 to an upper surface of the housing 410. The apparatus can include a thermal path from a location of initial freezing to its surroundings.

As the fluid or chamber is cooled from above a freezing point, the thermal path serves to efficiently reject heat stored in the location. For example, an optional metallic insert 430 is mounted from the location of initial freezing in the chamber to the top surface of the chamber would serve. Preferably, the metallic insert 430 is formed of a material that will not contaminate the fluid such as copper. A critical factor is use of any material or structure that assists a particular location become cold fastest, and so that progression of freezing is continuous from that location to the expanded end portions 407 of the chambers. The combination of having a hourglass-shaped chambers and the metallic insert 430 allows for freezing to initiate at the narrowed middle or central portion 405 of the hourglass-shaped chambers and expand outward to the expanded end portions 407.

In the above-described embodiments, the present invention is applied to a pump or a housing having an inlet chamber and an outlet chamber. Alternatively, the present invention may be applied to any enclosure in a liquid cooling system. The liquid cooling system preferably includes an electro-osmotic pump and a heat exchanger. As such, the size and volume reducing means, the air pockets, the compressible objects, and the compressible objects can be applied to any or each enclosure in the system, including tubing, of the liquid cooling system.

The present invention has been described in terms of specific embodiments incorporating details to facilitate the understanding of the principles of construction and operation of the invention. Such reference herein to specific embodiments and details thereof is not intended to limit the scope of the claims appended hereto. It will be apparent to those skilled in the art that modifications may be made in the embodiment chosen for illustration without departing from the spirit and scope of the invention.

What is claimed is:

1. An apparatus for preventing cracking of a liquid system, comprising:
   at least one heat exchanger having a top element and a bottom element, wherein the bottom element comprises a heat transfer element;
   a plurality of channels and passages formed within the bottom element to provide flow of a fluid therethrough such that heat is transferred between the bottom element and the fluid; and
   one or more compressible objects positioned within one or more of the channels and passages such that the one or more compressible objects form a seal between the one or more channels and the top element, wherein in an uncompressed state the compressible objects reduce a volume of each of the channels and passages having compressible objects and further wherein under pressure exerted within the channels and passages the compressible objects are compressed to increase the volume of each of the channels and passages.

2. The apparatus of claim 1, wherein the compressible objects accommodate a predetermined level of fluid expansion.

3. The apparatus of claim 2, wherein the predetermined level of fluid expansion is between 5 to 25 percent.

4. The apparatus of claim 1, wherein the compressible objects being capable of contracting and expanding between a minimum volume and a maximum volume.

5. The apparatus of claim 1, wherein the compressible objects being positioned with a portion of the top element.

6. The apparatus of claim 1, wherein the compressible objects are made of one of the following: sponge, foam, air-filled bubbles, or balloons.

7. The apparatus of claim 1, wherein the compressible objects are encapsulated in a gas or liquid impermeable package.

8. The apparatus of claim 7, wherein the package is formed of metallic barrier material or metallized plastic sheet material.

9. The apparatus of claim 7, wherein the package has a hydrophilic surface or coating.

10. The apparatus of claim 7, wherein the package is formed of plastic material.

11. The apparatus of claim 10, wherein the plastic material is selected from the group consisting of teflon, mylar, PET, PEN, and PVC.

* * * * *